US010901322B2

(12) United States Patent
Liu

(10) Patent No.: US 10,901,322 B2
(45) Date of Patent: Jan. 26, 2021

(54) METHODS FOR EVALUATING RESIST DEVELOPMENT

(71) Applicant: ASML NETHERLANDS B.V., Veldhoven (NL)

(72) Inventor: Peng Liu, Cupertino, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/605,542

(22) PCT Filed: Apr. 20, 2018

(86) PCT No.: PCT/EP2018/060243
§ 371 (c)(1),
(2) Date: Oct. 16, 2019

(87) PCT Pub. No.: WO2018/206275
PCT Pub. Date: Nov. 15, 2018

(65) Prior Publication Data
US 2020/0124973 A1    Apr. 23, 2020

Related U.S. Application Data

(60) Provisional application No. 62/505,596, filed on May 12, 2017.

(51) Int. Cl.
*G03F 7/20* (2006.01)
*H01L 21/027* (2006.01)
(Continued)

(52) U.S. Cl.
CPC ............. *G03F 7/705* (2013.01); *G03C 7/388* (2013.01); *H01L 21/0274* (2013.01); *H01L 21/67253* (2013.01)

(58) Field of Classification Search
CPC ..... G03F 7/705; G03C 7/388; H01L 21/0274; H01L 21/67253
See application file for complete search history.

(56) References Cited

U.S. PATENT DOCUMENTS

| 5,969,441 A | 10/1999 | Loopstra et al. |
|---|---|---|
| 6,046,792 A | 4/2000 | Van der Werf et al. |

(Continued)

FOREIGN PATENT DOCUMENTS

| EP | 1473596 | 11/2004 |
|---|---|---|
| TW | 200534036 | 10/2005 |

(Continued)

OTHER PUBLICATIONS

International Search Report and Written Opinion issued in corresponding PCT Patent Application No. PCT/EP2018/060243, dated Aug. 14, 2018.

(Continued)

*Primary Examiner* — Michelle M Iacoletti
(74) *Attorney, Agent, or Firm* — Pillsbury Winthrop Shaw Pittman LLP

(57) ABSTRACT

A method, including: obtaining a set of conditions for a resist development model for simulating a resist development process of a resist layer; and performing, by a hardware computer system, a computer simulation of the resist development process using the set of conditions and the resist development model to obtain a characteristic of the development of the resist layer, wherein the computer simulation separately simulates different certain different physical and chemical processes and characteristics of the resist development process.

20 Claims, 11 Drawing Sheets

(51) Int. Cl.
*H01L 21/67* (2006.01)
*G03C 7/388* (2006.01)

(56) References Cited

U.S. PATENT DOCUMENTS

| | | | |
|---|---|---|---|
| 7,016,017 | B2 | 3/2006 | Hansen |
| 7,587,704 | B2 | 9/2009 | Ye et al. |
| 8,458,626 | B1 | 6/2013 | Tirapu-Azpiroz et al. |
| 8,631,359 | B1 | 1/2014 | Huang et al. |
| 9,588,439 | B1 | 3/2017 | Bruguier et al. |
| 2005/0076322 | A1 | 4/2005 | Ye et al. |
| 2007/0283312 | A1 | 12/2007 | Huang et al. |
| 2009/0157360 | A1 | 6/2009 | Ye et al. |
| 2010/0099034 | A1 | 4/2010 | Sandstrom et al. |
| 2010/0251202 | A1 | 9/2010 | Pierrat |
| 2011/0112809 | A1 | 5/2011 | Biafore et al. |
| 2012/0079436 | A1* | 3/2012 | Flagello ............. G03F 7/70625 716/55 |
| 2016/0012175 | A1 | 1/2016 | Wu et al. |
| 2016/0313651 | A1 | 10/2016 | Middlebrooks et al. |
| 2016/0357900 | A1 | 12/2016 | Liu et al. |
| 2018/0017873 | A1* | 1/2018 | Biafore ................ G03F 7/30 |

FOREIGN PATENT DOCUMENTS

| | | |
|---|---|---|
| TW | 201314484 | 4/2013 |
| WO | 2017144379 | 8/2017 |

OTHER PUBLICATIONS

Taiwanese Office Action issued in corresponding Taiwanese Patent Application No. 107115369, dated Jun. 25, 2019.
Dammel, R.R. et al. "Improved Simulation of Photoresists Using New Development Models", Proc. of SPIE, vol. 3333, pp. 401-416, Jun. 29, 1998.

* cited by examiner

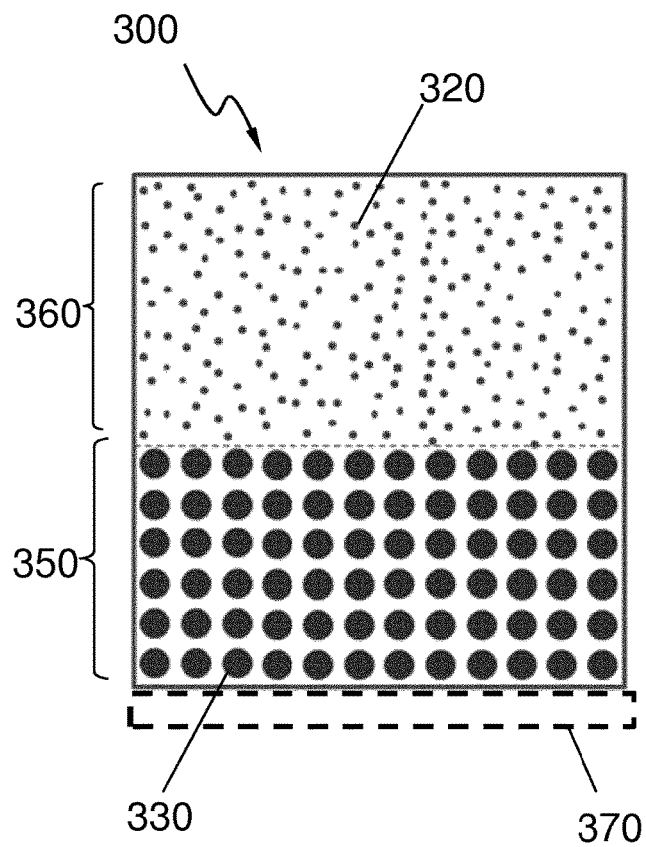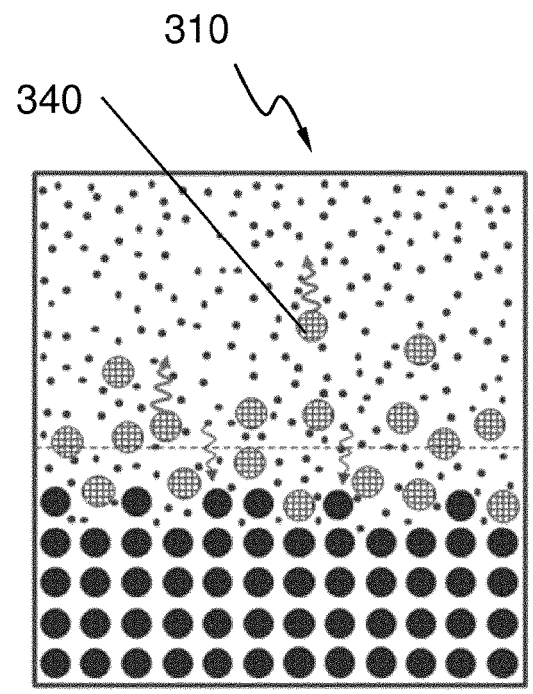
Fig. 3A　　　　　　　Fig. 3B
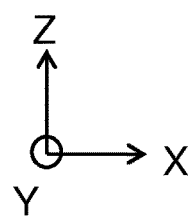

METHODS FOR EVALUATING RESIST DEVELOPMENT

CROSS-REFERENCE TO RELATED APPLICATIONS

This application is the U.S. national phase entry of PCT Patent Application No. PCT/EP2018/060243, filed Apr. 20, 2018, which claims the benefit of priority of U.S. patent application no. 62/505,596, which was filed on May 12, 2017 and which is incorporated herein in its entirety by reference.

FIELD

The description herein relates to lithographic apparatuses and patterning processes, and more particularly to methods for evaluating development of a resist layer, e.g., patterned by a lithographic apparatus or process.

BACKGROUND

A lithographic apparatus can be used, for example, in the manufacture of devices such as integrated circuits (ICs). In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of material to receive the pattern ("resist"), by methods such as irradiating the target portion with radiation patterned, according the pattern, from the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general in this case, the lithographic apparatus will have a magnification factor M (generally<1), the speed F at which the substrate is moved will be a factor M times that at which the projection beam scans the patterning device. More information with regard to lithographic apparatuses as described herein can be gleaned, for example, from U.S. Pat. No. 6,046,792, incorporated herein by reference in its entirety.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, metrology (e.g., SEM), etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

So, manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are typically involved in the patterning process.

SUMMARY

So, significant aspects to enabling a patterning process (i.e., a process of creating a device or other structure involving patterning (such as lithographic exposure or imprint), which may typically include one or more associated processing steps such as development of resist, etching, etc.) include developing the process itself, setting it up for monitoring and control and then actually monitoring and controlling the process itself.

To enable this, for a patterning process, it is desirable to determine (e.g., measure, simulate using one or more models that model one or more aspects of the patterning process, etc.) one or more parameters of interest, such as the critical dimension (CD) of a structure, an edge placement error, an overlay error between successive layers (i.e., the undesired and unintentional misalignment of successive layers) formed in or on the substrate, etc.

So, it is desirable to determine such one or more parameters of interest for structures created by a patterning process and use them for design, control and/or monitoring relating to the patterning process, e.g., for process design, control and/or verification. The determined one or more parameters of interest of patterned structures can be used for patterning process design, correction and/or verification, defect detection or classification, yield estimation and/or process control.

A mechanism to enable to determination of such parameters is computational lithography. Computational lithography models and simulates one or more apparatuses and/or processes of a patterning process. A significant part of many patterning processes is resist development to form a pattern (which pattern is typically used for etching). So, it is desirable to provide computational simulation and modeling of the resist development process. However, existing resist development modeling techniques are not very accurate for a wide range of patterns and can be to slow for full chip applications. So, it is desired to provide, for example, a resist development model and simulation that is accurate and comprehensive for a wide range of patterns. Additionally or alternatively, it is desired to provide, for example, a resist development model and simulation that can be solved fast enough for full chip applications.

In an embodiment, there is provided a method, comprising: obtaining a set of conditions for a resist development model for simulating a resist development process of a resist layer; and performing, by a hardware computer system, a computer simulation of the resist development process using the set of conditions and the resist development model to obtain a characteristic of the development of the resist layer, wherein the computer simulation separately simulates different certain different physical and chemical processes and characteristics of the resist development process.

In an embodiment, there is provided a method comprising: determining, by a hardware computer system, a characteristic of a diffusion in the development of a resist layer as if there were no chemical reaction in the development of the resist layer; determining, by the hardware computer system, a characteristic of the chemical reaction in the development of the resist layer as if there were no diffusion in the development of the resist layer; and determining, by the hardware computer system, a characteristic of the development of the resist layer based on the characteristic of the diffusion and the characteristic of the chemical reaction.

In an embodiment, there is provided a method comprising: determining, by a hardware computer system, a characteristic of diffusion in the development of a resist layer in a first direction, as if there were no diffusion in any directions perpendicular to the first direction; determining, by the hardware computer system, a characteristic of diffusion in the development of the resist layer in a second direction as if there were no diffusion in the first direction, the second direction being different from the first direction; and determining, by the hardware computer system, a characteristic of the development of the resist layer based on the characteristic of the diffusion in the first direction and the characteristic of the diffusion in the second direction.

In an embodiment, there is provided a non-transitory computer program product comprising machine-readable instructions for causing a processor to cause performance of a method as described herein.

In an embodiment, there is provided a system comprising: a lithographic apparatus comprising a pattern transfer system arranged to transfer a pattern onto a resist-coated substrate; and a non-transitory computer program as described herein. In an embodiment, the lithographic apparatus further comprises a support structure configured to hold a patterning device to modulate a radiation beam for projection by the pattern transfer system to the substrate.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which:

FIG. 3A schematically illustrates an initial state of a resist layer combined with a developer;

FIG. 3B schematically illustrates a resist layer with a developer at a point in time after the initial state;

Figure 1:
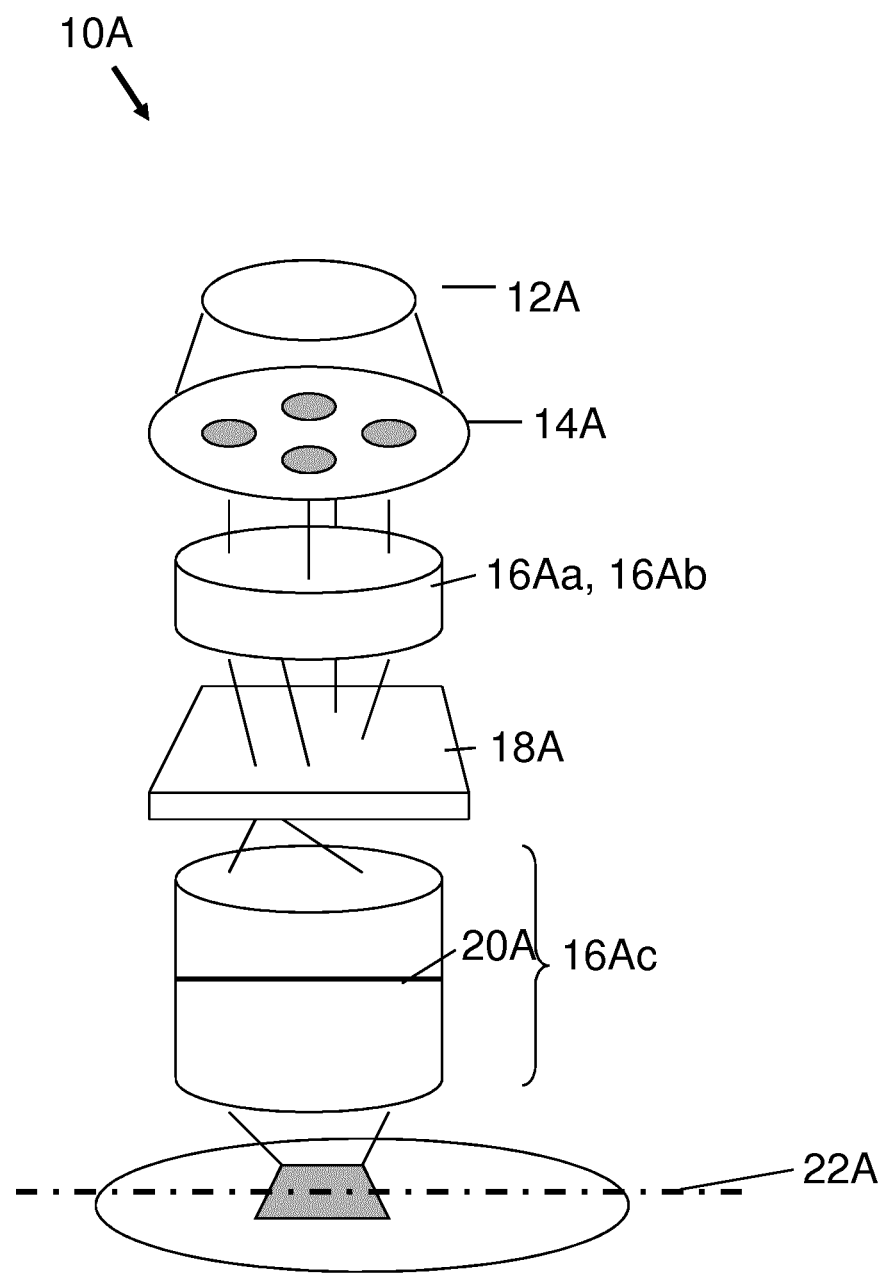
FIG. 1 is a block diagram of various subsystems of a lithography system.

Features and advantages of embodiment will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a device can be defined as the smallest width of a feature (e.g., line) or trench (e.g., hole) or the smallest space between two features or two trenches. Thus, the CD determines the overall size and density of the designed device. Of course, one of the goals in device fabrication is to faithfully reproduce the original device design on the substrate (via the patterning device).

So, in a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer and/or the post-development spatial distribution of developed resist. A resist model can be used to calculate the resist image from the aerial image, an example of which can be found in commonly assigned U.S. Patent Application Publication No. 2009-0157360, the disclosure of which is hereby incorporated by reference in its entirety. The resist model is related only to properties of the resist layer (e.g., effects of chemical processes which occur during exposure, post exposure bake and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
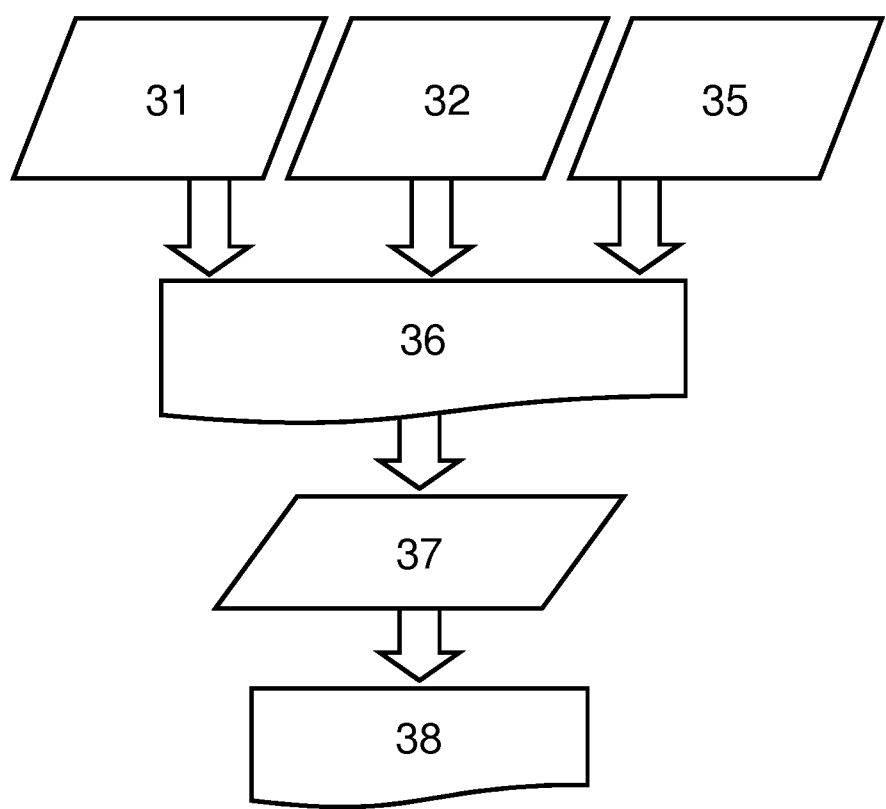
FIG. 2 is a block diagram of simulation models corresponding to parts or subsystems of patterning process.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

A resist layer is a layer of material that adopts a pattern provided to it and may have various chemical compositions. The resist layer usually has a small but finite thickness that may be comparable in size to patterns provided onto the resist. Typically the resist is a radiation-sensitive layer that receives a radiation intensity distribution in the form of a pattern, wherein the radiation (such as EUV or DUV) induces a chemical reaction within the resist to realize a latent image of the pattern in the resist. The resist layer may undergo various treatments in a patterning process. For example, as noted above, the resist may be patterned, e.g., exposed to radiation to form a pattern. Further, the resist may undergo a post-exposure bake (PEB), development (e.g., positive tone development or negative tone development), and/or a hard bake.

Of those various resist treatments, resist development is a significant step in the patterning process. Resist redevelopment is mainly responsible for the resist profile emerging from the patterned resist, typically patterned by an intensity distribution applied to the resist during exposure.

It is therefore significant to capture the resist development effect in computational lithography applications (e.g., optical proximity correction (OPC) and optimization of illumination with a patterning device pattern (referred to often as source-mask optimization (SMO)) in order to accurately predict pattern printing properties such as critical dimension (CD), edge placement error (EPE), process window (PW), etc. Therefore, it is desirable to provide a resist development model with the ability to predict resist development to enable, for example, more accurate lithography and higher yield.

Accordingly, in an embodiment, there is provided a resist development model to predict resist development that is more accurate than an empirical model. In an embodiment, the resist development model is fast enough for a full-chip application. In an embodiment, the resist development model is simplified from a rigorous first-principle model but retains a significant amount of physical comprehensiveness.

Existing resist development models used in full-chip applications are empirical. That is, they are not derived from first principles that contain mechanisms for observed effects (e.g., developer loading). Thus, these empirical models lack the physical comprehensiveness for diverse groups of patterns, leading to over- or under-predicting resist behaviors for certain patterns.

So, there is provided herein a new resist development model for, e.g., full-chip applications. As noted above, in an embodiment, the new resist development model is based on first principles (i.e., equations describing underlying physical and chemical properties and processes of the resist, the developer and their combination). In an embodiment, then, the new resist development model simulates underlying physical and chemical properties and processes of the resist based on first principles techniques. So, in an embodiment, there is provided a fast physical resist development model for full-chip computational lithography applications that simulate how development proceeds in a resist development system. In an embodiment, the resist development process is a positive tone resist development process wherein the resist layer is developed with a positive tone developer and the resist development model models the positive tone resist development process. In an embodiment, the resist development process is a negative tone resist development process, wherein the resist layer is developed with a negative tone developer and the resist development model models the negative tone resist development process.

To aid understanding the model, a cell of a portion of a resist development system is depicted in FIG. 3. Referring to FIG. 3A, an initial state 300 of a cell of a portion of a resist development system is depicted. At the initial state, there is undissolved resist 330 (which is generally immobile) in a resist layer 350 after a pattern transfer and a developer 320 in a developer layer 260 which has been applied to the resist 330. In an embodiment, the top boundary of the cell corresponds to the environment (e.g., air) and the bottom boundary of the cell corresponds to the substrate (e.g., silicon wafer, which optionally has one or more prior applied layers thereon, shown here for reference in dotted line format as 370) on which the resist is provided.

Then, referring to FIG. 3B, a further state 310 of the cell of the portion of the resist development system at a time after the initial state is depicted. As seen in FIG. 3B, the developer 320 reacts with the resist 330 and portions of the developer 320 diffuses into the resist 330 and portions of the resist 330 diffuses into the developer 320. Generally, a significant portion of the resist 330 that diffuses into the developer 320 is dissolved resist 340 (which is generally mobile).

So, the resist development involves various different chemical and physical processes and characteristics. In particular, the resist development process can be broken into two main aspects—a first aspect is the chemical reaction between the developer and the resist (e.g., the dissolution of the resist and the depletion of the developer) and a second aspect is diffusion of various physical components (e.g., diffusion of the developer and diffusion of the dissolved resist).

Thus, the physical resist development model comprises mathematical equations corresponding to various such different chemical and physical processes and characteristics. Thus, the physical resist development model separately simulates various such different chemical and physical processes and characteristics. In the equations herein, the square brackets [ . . . ] denote a normalized quantity (e.g., normalized to $0 \leq [\ldots] \leq 1$). In an embodiment, the variables are normalized to initial or final quantities (e.g., the resist amount (e.g., density, concentration, etc.) is normalized to an initial resist amount, the developer amount (e.g., concentration) is normalized to an initial developer amount, etc.).

In an embodiment, the physical resist development model comprises a rate law for the resist dissolution reaction, which can have the form of:

$$\frac{\partial [A]}{\partial t} = -k[A]^p [C]^q \tag{1}$$

wherein A is the amount (e.g., density) of undissolved resist (e.g., resist 330 which is generally immobile) (wherein in the normalization context, 0 represents the resist has developed away and 1 represents the original resist remain), C is the concentration of the developer (e.g., developer 320) (wherein in the normalization context, 0 represents that the developer has been consumed and 1 represents the initial developer concentration), p and q are reaction orders, k is a dissolution reaction rate coefficient, and t is time. In an embodiment, p, q and k are typically defined for the particular resist development system and the particular evaluation thereof and depend generally on the involved materials (e.g., resist type, developer type, etc.) and associated conditions (e.g., temperature, etc.). In an embodiment, p, q and k are user defined. In an embodiment, p, q and k are experimentally determined (e.g., by fitting to experimental data).

As a result of the resist dissolution, there is generation of a by-product, such as dissolved resist (e.g., dissolved resist 340). Moreover, that by-product diffuses in, e.g., the developer (e.g., the developer 320). Accordingly, in an embodiment, the physical resist development model comprises an equation for the by-product generation and diffusion, which can have the form of:

$$\frac{\partial [B]}{\partial t} = -r_b \frac{\partial [A]}{\partial t} + \nabla (D_b \nabla [B]) \tag{2}$$

wherein B is the amount (e.g., density) of by-product such as the dissolved resist (e.g., dissolved resist 340 which is generally mobile) (wherein in the normalization context, 0 represents no dissolved resist and 1 represents the maximum dissolved resist), $r_b$ is ratio of the B generation rate to the A dissolution rate, and $D_b$ is the diffusivity for the by-product (e.g., dissolved resist) diffusion (and is dependent on A, B and C in general). In this equation, the first term generally corresponds to the by-product generation while the second term generally corresponds to the diffusion of the by-product.

Further, as a result of the resist dissolution, there is depletion of the developer (e.g. developer 320). Moreover, the developer diffuses in, e.g., the resist (e.g., the resist 330). Accordingly, in an embodiment, the physical resist development model comprises an equation for the developer depletion and diffusion, which can have the form of:

$$\frac{\partial [C]}{\partial t} = +r_c \frac{\partial [A]}{\partial t} + \nabla (D_c \nabla [C]) \tag{3}$$

wherein $r_c$ is the ratio of the C depletion rate to the A dissolution rate and $D_c$ is the diffusivity for the developer diffusion (and is dependent on A, B and C in general). In this equation, the first term generally corresponds to the developer depletion while the second term generally corresponds to the diffusion of the developer.

In an embodiment, $r_b$ and $r_c$ are typically defined for the particular resist development system and the particular evaluation thereof and depend generally on the involved materials (e.g., resist type, developer type, etc.) and associated conditions (e.g., temperature, etc.). In an embodiment, $r_b$ and $r_c$ are user defined. In an embodiment, $r_b$ and $r_c$ are experimentally determined (e.g., by fitting to experimental data).

As noted above, in general, $D_b$ and $D_c$ are functions of [A], [B] and [C]. It can be assumed that $D_b$ is mainly dependent on [A], and $D_c$ is mainly dependent on [A] and [B] with the following relationships, which are largely derived from free volume theory:

$$D_b = D_{b0}\exp\left(-\alpha_b \frac{[A]}{\beta_b - [A]}\right) \quad (4)$$

$$D_c = D_{c0}\exp\left(-\alpha_c \frac{[A]+[B]}{\beta_c - [A] - [B]}\right) \quad (5)$$

wherein $D_{b0}$ is an initial diffusivity for the by-product, wherein $D_{c0}$ is an initial diffusivity for the developer, and $\alpha_b$, $\alpha_c$, $\beta_b$ and $\beta_c$ are constants. In an embodiment, $\alpha_b$, $a_c$, $\beta$, $\beta_c$, $D_{b0}$ and $D_{c0}$ are typically defined for the particular resist development system and the particular evaluation thereof and depend generally on the involved materials (e.g., resist type, developer type, etc.) and associated conditions (e.g., temperature, etc.). In an embodiment, $\alpha_b$, $\alpha_c$, $\beta$, $\beta_c$, $D_{b0}$ and $D_{c0}$ are user defined. In an embodiment, $\alpha_b$, $\alpha_c$, $\beta$, $\beta_c$, $D_{b0}$ and $D_{c0}$ are experimentally determined (e.g., by fitting to experimental data).

Now, this model can be implemented by solving the equations for a particular time period using a particular initial set of conditions and a specification of the dimensions for which the equations are solved. For example, in a typical implementation, the model will be solved for 3-dimensions (x, y, z) although the solution could be limited to two dimensions (e.g., z and y or x) or a single dimension. Further, the size and configuration of the dimensional region (e.g., area or volume) to be evaluated will specified for the resist and developer. As an example, for the resist, the vertical dimension (e.g., thickness of the resist) at the initial state will be specified. Further, the area of resist that can be dissolved (compared to regions that are not primarily dissolvable by the developer) will be solved; in other words, a solubility distribution is provided that approximately represents or is the resist image (e.g., produced by exposure where the resist is a radiation sensitive resist) at the initial state and describes those areas of the resist susceptible to be dissolved from those areas that are not. As another example, for the developer, the vertical dimension (e.g., thickness of the developer) at the initial state will be specified along with the area of developer that is applied at the initial state.

Further, a time period for which the equations are evaluated are specified. For example, a development time selected from 10 to 200 seconds can be selected, for example about 20 s or about 60 s.

Additionally, a set of other initial conditions are specified. In a typical embodiment, at all locations in the developer (e.g., developer 320) at the initial state, [A]=0, [B]=0, and [C]=1. Further, in a typical embodiment, at least at all locations in the resist (e.g., resist 330) intended to be dissolved at the initial state, [A]=1, [B]=0, and [C]=0. As noted above, in an embodiment, A is the amount (e.g., density) of undissolved resist (e.g., resist 330) which is generally immobile), B is the amount (e.g., density) of by-product, C is the concentration of the developer (e.g., developer 320), and the values are normalized in this case to a range from 0 to 1. Thus, at the initial condition, there is no resist in the developer, no by-product in the developer and full concentration of developer in the developer (e.g., the initial concentration amount of the developer). And, at the initial condition, there is a full concentration or density of resist in the resist (e.g., the initial concentration or density amount), no by-product in the resist and no developer in the resist.

Further, boundary conditions can be specified in relation to the resist development system (e.g., the top and bottom boundaries of the cell as depicted in FIG. 3). For example, in a typical implementation, the top boundary interfaces with a gas environment (e.g., air) and so at the top (i.e., at the interface between the developer and the environment), the flux=$f_t$ (which can be 0) or [C]=1. As another example, in a typical implementation, the bottom boundary interfaces with a substrate and so at the bottom (i.e., at the interface between the resist and the substrate), flux=$f_b$ (which can 0) or [A]=1.

So, after solving the equations for a particular period of time t (using, e.g., finite element, finite difference, etc. techniques), the solution of the equations will realize values of A, B and C as applicable for the various locations in the specific particular dimensional region (e.g., area, volume, etc.). In particular, since the dissolution of the resist primarily defines the formation of the pattern in the resist, the spatial or volumetric distribution of values of A provides a representation of the developed pattern as a result of the development. That is, referring to FIG. 3A, it can be seen that the values of A at an initial condition may all have the value 1 (where the values of A are normalized and normalized to 1) at all locations in the resist layer 350. Then after a certain time as shown in FIG. 3B, some of the locations in the resist layer will have values of A of 0 showing where a trench of the pattern is formed. At other location, the values of A remain 1, while others may have some value between 0 and 1, typically indicating a roughness of the edge or wall of the pattern.

In a further embodiment, the physical resist development model can be characterized according to different equations although they again characterize the chemical reactions and diffusion in a resist development system. That is, the physical resist development model comprises a different set of mathematical equations corresponding to various such chemical and physical processes and characteristics.

In an embodiment, the physical resist development model comprises a rate law for the resist dissolution reaction, which can have the form of:

$$\frac{\partial [A]}{\partial t} = -k_a[S][A]^p[C]^q \quad (6)$$

wherein S is resist solubility (wherein in the normalization context, 0 represents no solubility and 1 represents the maximum solubility) and $k_a$ is a reaction constant.

As a result of the resist dissolution, there is generation of a by-product, such as dissolved resist (e.g., dissolved resist 340). Moreover, that by-product diffuses in, e.g., the developer (e.g., the developer 320). Accordingly, in an embodiment, the physical resist development model comprises an equation for the by-product generation and diffusion, which can have the form of:

$$\frac{\partial [B]}{\partial t} = +k_b[S][A]^p[C]^q + \nabla(D_b\nabla[B]) \quad (7)$$

wherein $k_b$ is a reaction constant. In this equation, the first term generally corresponds to the by-product generation while the second term generally corresponds to the diffusion of the by-product.

Further, as a result of the resist dissolution, there is depletion of the developer (e.g. developer 320). Moreover, the developer diffuses in, e.g., the resist (e.g., the resist 330). Accordingly, in an embodiment, the physical resist development model comprises an equation for the developer depletion and diffusion, which can have the form of:

$$\frac{\partial [C]}{\partial t} = -k_c[S][A]^p[C]^q + \nabla(D_c\nabla[C]) \quad (8)$$

wherein $k_c$ is a reaction constant. In this equation, the first term generally corresponds to the developer depletion while the second term generally corresponds to the diffusion of the developer.

In an embodiment, $k_a$, $k_b$ and $k_c$ are typically defined for the particular resist development system and the particular evaluation thereof and depend generally on the involved materials (e.g., resist type, developer type, etc.) and associated conditions (e.g., temperature, etc.). In an embodiment, $k_a$, $k_b$ and $k_c$ are user defined. In an embodiment, $k_a$, $k_b$ and $k_c$ are experimentally determined (e.g., by fitting to experimental data).

The S is resist solubility and can be specified in terms of the exposure energy used to pattern the resist and can take the following form:

$$[S] = [S]_{min} + \frac{1 - [S]_{min}}{1 + \exp[-4K(E - E_{th})]} \quad (9)$$

wherein $[S]_{min}$ is the minimum solubility, E is the applied exposure energy, $E_{th}$ is the exposure energy threshold for the resist to cause the resist to be patterned, and K is a constant. In an embodiment, $[S]_{min}$, $E_{th}$ and K are typically defined for the particular resist development system and the particular evaluation thereof and depend generally on the involved materials (e.g., resist type, developer type, etc.) and associated conditions (e.g., temperature, etc.). In an embodiment, $[S]_{min}$, $E_{th}$ and K are user defined. In an embodiment, $[S]_{min}$, $E_{th}$ and K are experimentally determined (e.g., by fitting to experimental data).

Additionally or alternatively, in an embodiment, the solubility related property, namely the dissolution rate coefficient k for equation (1) or the resist solubility [S] for equations (6)-(8) (which are related to each other by a dissolution coefficient curve of the form of, e.g., $k=k_a*[S]$), is obtained via an inverse process from experimental data in the form of, e.g., a normalized contrast curve. Specifically, in an embodiment, the solubility related property (e.g., the dissolution coefficient) is expected to be a function of the resist latent image as a result of, e.g., radiation exposure. So, although there may be no direct measurement data for this property, its model form can be derived from other experimental properties relating to the radiation exposure. For example, the process of resist development after an exposure (e.g., a flood exposure where all the resist is exposed without the radiation being patterned) can be generally characterized experimentally by a so-called normalized contrast curve, wherein the remaining resist thickness (normalized by the initial thickness) is determined as a function of radiation exposure energy. Thus, the normalized contrast curve can have the form of f(E), wherein E is the applied exposure energy. So, in an embodiment, a resist development model as described above can be solved for the same conditions as the experimental resist exposure and development process to compute values of a parameter of the contrast curve, e.g., the thickness and so the dissolution coefficients for particular exposure energies can then be obtained via an inverse process (i.e. k(E)=Inverse {f(E)}). For example, the resist development model of equations (1)-(5) can be run for various values of k that produce thickness values that fall on the normalized contrast curve f(E) to determine the corresponding values of E for each of those values of k. Desirably, enough values of k are determined to match the values of E expected to be used in resist development processes that will be modeled using the resist development model described herein.

So, like the embodiment of the model associated with equations (1)-(5), a set of conditions can be defined and after solving the equations for the model associated with equations (6)-(9) for a particular period of time t, the solution of the equations will realize values of A, B and C as applicable for the various locations in the specific particular dimensional region (e.g., area, volume, etc.). In particular, since the dissolution of the resist primarily defines the formation of the pattern in the resist, the spatial or volumetric distribution of values of A provides a representation of the developed pattern as a result of the development. That is, referring to FIG. 3A, it can be seen that the values of A at an initial condition may all have the value 1 (where the values of A are normalized and normalized to 1) at all locations in the resist layer 350. Then after a certain time as shown in FIG. 3B, some of the locations in the resist layer will have values of A of 0 showing where a trench of the pattern is formed. At other location, the values of A remain 1, while others may have some value between 0 and 1, typically indicating a roughness of the edge or wall of the pattern.

Rigorous calculation of the development of a resist layer using the models described herein can be time consuming. In particular, it can be computationally expensive to solve the previously described reaction-diffusion partial differential equations rigorously in three dimensions. So, in an embodiment, there is provided an approximate but fast method to solve the equations. In particular, in an embodiment, the resist development computation problem is decomposed into sub-problems of less complexity. For example, in an embodiment, the three-dimensional problem is decomposed into sub-problems of lower dimensions, e.g., vertical diffusion and horizontal diffusion. In an embodiment, additionally or alternatively, a simultaneous reaction-diffusion problem may be decomposed into separate reaction-only and diffusion-only problems. The decomposition may be cascaded and repeated in multiple shorter pipelines to obtain better accuracy. Furthermore, various decompositions may be combined. For example, dimensional decomposition can be combined with the reaction-diffusion decomposition in various combinations as discussed further hereafter.

Figure 4:
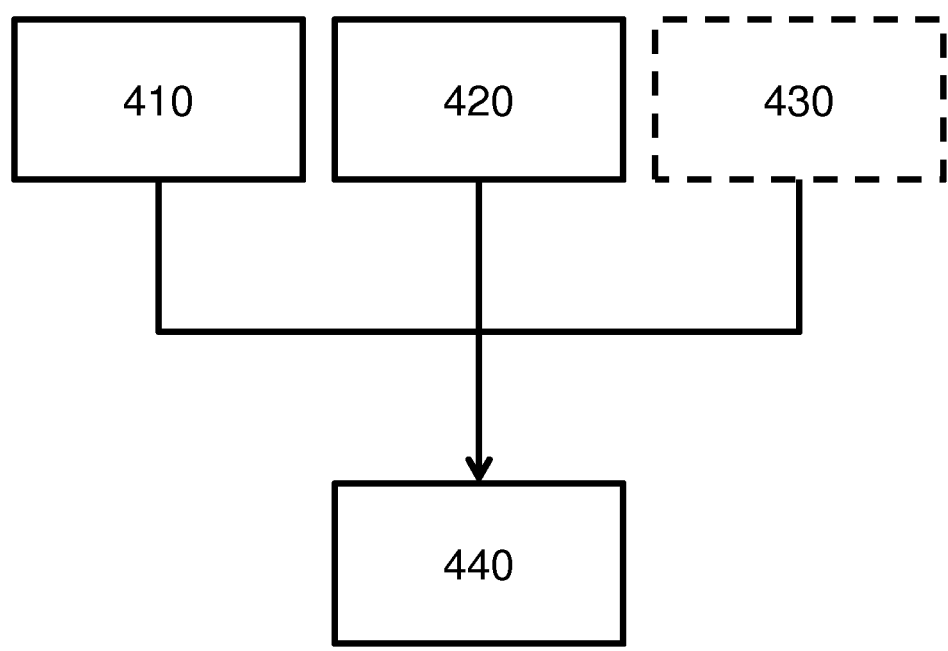
FIG. 4 shows a flow chart for a method of obtaining (e.g., determines or estimates) at least a characteristic of multi-dimensional diffusion in a resist layer on a substrate, according to an embodiment.

Accordingly, FIG. 4 shows a flow chart for a method of obtaining (e.g., determining or estimating) at least a characteristic of multi-dimensional (e.g., three-dimensional) diffusion in the development of a resist layer on a substrate, according to an embodiment. This method independently obtains (e.g., determines or estimates) at least a characteristic of diffusion in the development of the resist layer in a first direction (e.g., the vertical direction, namely the direction perpendicular to the substrate), at least a characteristic of diffusion in the development in a second direction (e.g., a lateral direction, namely a direction parallel to the substrate) perpendicular to the first direction, and optionally at least a characteristic of diffusion in the development in a third direction perpendicular to both the first and second directions. The method then obtains (e.g., determines or estimates) at least a characteristic of the multi-dimensional (e.g., three-dimensional) diffusion in the development based on the characteristic of the diffusion in the development in the first direction and the characteristic of the diffusion in the development in the second direction, and optionally the characteristic of the diffusion in the development in the third direction. For example, in step 410, at least a characteristic of diffusion in the development in the first direction is obtained (e.g., determined or estimated) as if there were no diffusion in the development in any directions perpendicular to the first direction. For example, the equations (or one or more parts thereof) described above of the resist development model that are associated with diffusion are solved for the particular first direction. In step 420, at least a characteristic of diffusion in the development in the second direction is obtained (e.g., determined or estimated) as if there were no diffusion in the development in the first direction. For example, the equations (or one or more parts thereof) described above of the resist development model that are associated with diffusion are solved for the particular second direction. In step 420, according to an embodiment, at least a characteristic of diffusion in the development in directions (all lateral directions, namely all directions parallel to the substrate) perpendicular to the first direction may be obtained. In optional step 430, at least a characteristic of diffusion in the development in the third direction is obtained (e.g., determined or estimated) as if there were no diffusion in the development in the first direction. For example, the equations (or one or more parts thereof) described above of the resist development model that are associated with diffusion are solved for the particular third direction. In step 440, at least a characteristic of multi-dimensional diffusion in the development of the resist layer is obtained (e.g., determined or estimated) based on the characteristic of the diffusion in the development in the first direction, the characteristic of the diffusion in the development in the second direction, and optionally the characteristic of the diffusion in the development in the third direction. In an embodiment, the at least a characteristic of multi-dimensional diffusion in the development of the resist layer is obtained by combination (e.g., addition) of the separate characteristics. In an embodiment, the determined diffusion is of just resist (e.g., dissolved resist), of just developer, or of the combination of resist and developer. In an embodiment, the diffusion of just the resist can be determined separately from the diffusion of just the developer and then the results thereof combined.

The characteristic of the diffusion in the development may include one or more various characteristics of the resist layer and/or of the developer layer. For example, the characteristic of the diffusion in the development may include translation, rotation, tilt, contraction, expansion, etc. at one or more locations of the resist layer or at one or more locations of the developer. As additional or alternative example, the characteristic of the diffusion in the development may include a representation of an amount of material (e.g., concentration, density), a change in the amount, etc. at one or more locations of the resist layer or at one or more locations of the developer. As additional or alternative example, the characteristic can be one or more geometric characteristics of parts or locations of a resist layer, such as CD, edge placement error, sidewall angle, etc. (although these characteristics will typically be derived from another characteristic such as an amount, or change in amount, of material as described above). The characteristic may have constraints (e.g., physical, geometrical or mechanical constraints). For example, material may not be able to diffuse into the substrate and/or diffuse into the environment (which will typically be located at the top but can also be located at a side, e.g., the edge of the substrate). As a further example, material may not be able to diffuse into a non-soluble portion of the resist layer. The constraints may be represented as boundary conditions.

Figure 5:
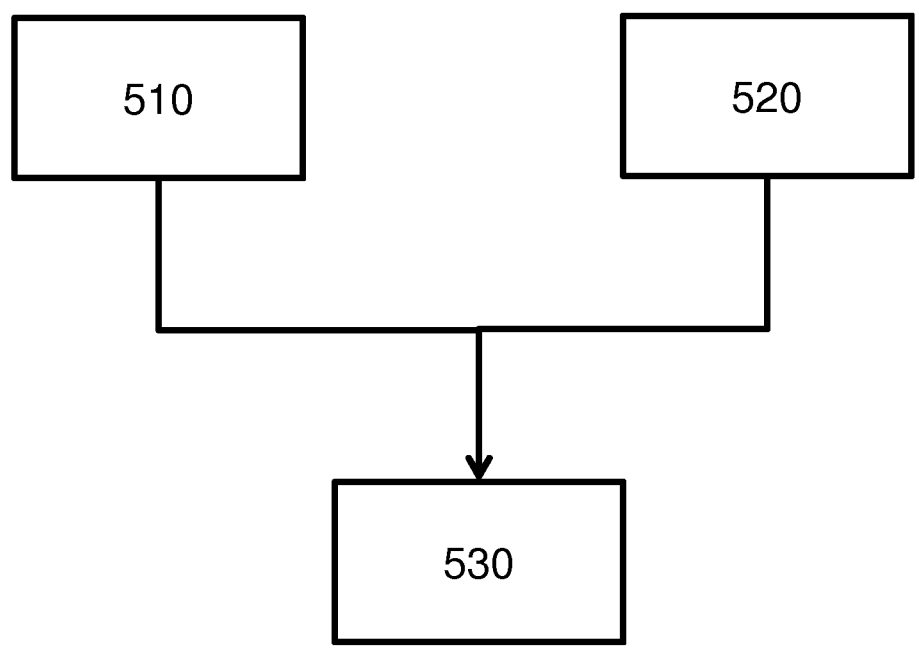
FIG. 5 shows a flow chart for a method of obtaining (e.g., determines or estimates) at least a characteristic of development in a resist layer on a substrate, according to an embodiment.

FIG. 5 shows a flow chart for a method of obtaining (e.g., determining or estimating) at least a characteristic of the development of a resist layer on a substrate, according to an embodiment. This method independently obtains (e.g., determines or estimates) at least a characteristic of diffusion in the development of the resist layer and at least a characteristic of a chemical reaction in the development. The method then obtains (e.g., determines or estimates) at least a characteristic of the development based on the characteristic of the diffusion in the development and the characteristic of the chemical reaction in the development. For example, in step 510, at least a characteristic of diffusion in the development is obtained (e.g., determined or estimated) as if there were no chemical reaction in the development. For example, the equations (or one or more parts thereof) described above of the resist development model that are associated with diffusion are solved. In step 520, at least a characteristic of the chemical reaction in the development is obtained (e.g., determined or estimated) as if there were no diffusion in the development. For example, the equations (or one or more parts thereof) described above of the resist development model that are associated with the chemical reaction are solved. In step 530, at least a characteristic of the development of the resist layer is obtained (e.g., determined or estimated) based on the characteristic of the diffusion in the development and the characteristic of the chemical reaction in the development. In an embodiment, the at least a characteristic of the development of the resist layer is obtained by combination (e.g., addition) of the separate characteristics of the diffusion and the chemical reaction. In an embodiment, the determined diffusion is of just resist (e.g., dissolved resist), of just developer, or of the combination of resist and developer. In an embodiment, the diffusion of just the resist can be determined separately from the diffusion of just the developer and then the results thereof combined. In an embodiment, the determined chemical reaction can be decomposed into components, such as the resist dissolution, by-product generation and/or developer depletion individually or combinations thereof. In an embodiment, just the resist dissolution can be determined separately from just the developer depletion and then the results thereof combined The characteristic of the development may include one or more various characteristics of the resist layer and/or of the developer layer. For example, the characteristic of the development may include translation, rotation, tilt, contraction, expansion, etc. at one or more locations of the resist layer or at one or more locations of the developer. As another example, the characteristic of the development may include a representation of an amount of material (e.g., concentration, density), a change in the amount, etc. at one or more locations of the resist layer or at one or more locations of the developer. As another example, the characteristic can be one or more geometric characteristics of parts or locations of a resist layer, such as CD, edge placement error, sidewall angle, etc. (although these characteristics will typically be derived from another characteristic such as an amount, or change in amount, of material as described above). The characteristic may have constraints (e.g., physical, geometrical or mechanical constraints). For example, material may not be able to diffuse into the substrate and/or diffuse into the environment (which will typically be located at the top but can also be located at a side, e.g., the edge of the substrate). As a further example, material may not be able to diffuse into a non-soluble portion of the resist layer. As a further example, resist may not be able to react in a non-soluble portion of the resist layer. The constraints may be represented as boundary conditions.

Figure 6:
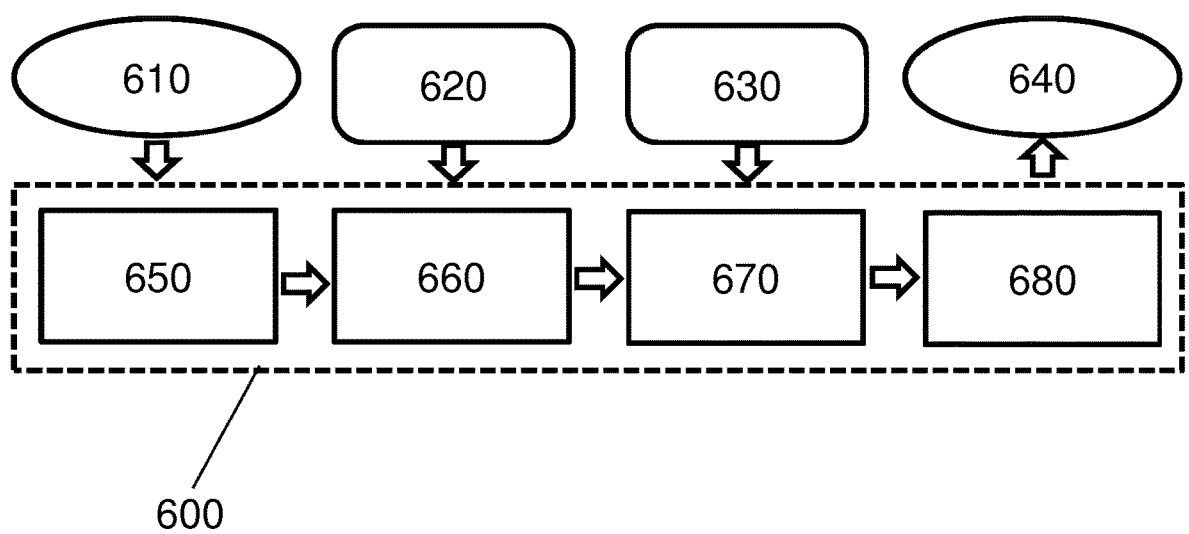
FIG. 6 shows a flow for a method of obtaining (e.g., determines or estimates) at least a characteristic of development in a resist layer on a substrate, according to an embodiment.

FIG. 6 shows a chart for a method of obtaining (e.g., determining or estimating) at least a characteristic of the development of a resist layer on a substrate, according to an embodiment. In this embodiment, the solving of the resist development model is decomposed as described above in relation to FIGS. 4 and 5. While both the decomposition of FIGS. 4 and 5 are used, an embodiment of the method could just do one type of decomposition. Further, while this embodiment describes a decomposition between chemical reaction and diffusion and a decomposition between diffusion in one direction and diffusion in another direction, the decomposition can be of a different type or nature. For example, the decomposition can be more granular (e.g., decomposing reactions into different components, decomposing directions into more or different directions, etc.), can be of different combinations (e.g., decomposing into a diffusion in a particular direction and a reaction), etc. Further, while this embodiment describes a particular order of solving the decomposed portions, the order can be different (e.g., a reaction can be calculated before diffusion, diffusion in different directions can be solved in a different order, etc.).

Referring to FIG. 6, a method 600 of solving the resist development model is schematically depicted. To the method 600 are provided an initial resist development system state 610, a solubility distribution 620, and model parameters 630.

In an embodiment, the initial resist development system state 610 comprises various data and/or boundary conditions describing the resist development system. For example, the initial resist development system state 610 includes a specification of the dimensions for which the equations are solved. For example, in a typical implementation, the model will be solved for 3-dimensions (x, y, z) although the solution could be limited to two dimensions (e.g., z and y or x) or a single dimension. Further, the size and configuration of the dimensional region (e.g., area or volume) to be evaluated will specified for the resist and developer. As an example, for the resist, the vertical dimension (e.g., thickness of the resist) at the initial state will be specified. As another example, for the developer, the vertical dimension (e.g., thickness of the developer) at the initial state will be specified along with the area of developer that is applied at the initial state. Further, a time period for which the equations are evaluated can be specified. For example, a development time selected from 10 to 200 seconds can be selected, for example about 20 seconds or about 60 seconds. Additionally, a set of other initial conditions can be specified. In a typical embodiment, at all locations in the developer (e.g., developer 320) at the initial state, [A]=0, [B]=0, and [C]=1. Further, in a typical embodiment, at least at all locations in the resist (e.g., resist 330) intended to be dissolved at the initial state, [A]=1, [B]=0, and [C]=0. Further, boundary conditions can be specified in relation to the resist development system (e.g., the top and bottom boundaries of the cell as depicted in FIG. 3). For example, in a typical implementation, the top boundary interfaces with a gas environment (e.g., air) and so at the top (i.e., at the interface between the developer and the environment), the flux=$f_t$ (which can be 0) or [C]=1. As another example, in a typical implementation, the bottom boundary interfaces with a substrate and so at the bottom (i.e., at the interface between the resist and the substrate), flux=$f_b$ (which can 0) or [A]=1.

In an embodiment, the solubility distribution 620 comprises a specification of the regions of the resist layer having low solubility (and thus not highly susceptible to dissolution by the developer) and the regions of the resist layer having high solubility (and thus susceptible to dissolution by the developer). Thus, the solubility distribution approximately represents or is the resist image (e.g., produced by exposure where the resist is a radiation sensitive resist) and describes those areas of the resist susceptible to be dissolved from those areas that are not. In an embodiment, the solubility distribution 620 is a spatial or volumetric representation of the distribution of varying solubility of the resist layer. In an embodiment, the variability of the solubility is due to exposure by radiation of the resist layer.

In an embodiment, the model parameters 630 comprise a specification of the values of various coefficients, constants, orders, etc. of the equations of the computational resist development model. For example, the model parameters 630 can comprise values of $k_a$, $k_b$ and $k_c$, values of p and q, and so on.

With the initial resist development system state 610, the solubility distribution 620, and the model parameters 630, the equations of the computational resist development model can be solved for a particular development to yield a result resist development system state 640 (e.g., a particular state of the resist in terms of which portions are developed, which portions are not, and which portions are partially developed).

As noted above, in this example embodiment, the resist development model is decomposed between chemical reaction and diffusion and decomposed between diffusion in one direction and diffusion in at least one other direction. In this example, at 650, diffusion in a particular first direction is solved. In an embodiment, the first direction is in the Z direction (e.g., vertical). At 660, the chemical reaction is separately solved. At 670, diffusion in a particular second direction is separately solved. In an embodiment, the second direction is in a direction substantially perpendicular to the Z direction (e.g., horizontal). At 680, the chemical reaction is separately solved.

So, an example of solving the equations according to method 600 for the resist development model described with respect to the equations (6)-(9) is presented as follows.

At 650, solving for the vertical (Z) diffusion of developer C into resist A without solving for the chemical reaction can described by the following equations:

$$\frac{\partial [C_1]}{\partial t} = \frac{\partial}{\partial z} D_c(z) \frac{\partial [C_1]}{\partial z} \qquad (10)$$

$$[C_1] = [C_1(z)] \qquad (11)$$

$$D_c(z) = \begin{cases} D_{c0}, & z > H \\ D_{ca}, & z < H \end{cases} \qquad (12)$$

wherein $C_1$ represents the developer C for this separate calculation of developer diffusion, H is the resist thickness, $D_{c0}$ and $D_{ca}$ represents the diffusivities outside the resist (e.g., in the developer) and within the resist respectively. Other properties would be unchanged by the design of the algorithm. Specifically, for example, $$[A_1] = [A_0] = \begin{cases} 0, & z > H \\ 1, & z < H \end{cases} \qquad (13)$$

$$[B_1] = [B_0] = 0 \qquad (14)$$

So, at 650, the resist development model reduces to a one dimensional diffusion equation with a non-uniform diffusivity. The solution to this problem can be pre-computed. As will be appreciated, a similar set of equations and conditions could be specified for the vertical (Z) diffusion of the by-product B without solving for the chemical reaction.

At 660, solving for the chemical reaction without solving for the diffusion can described by the following equations:

$$\frac{d[A_2]}{dt} = -k_a [S][A_2]^p [C_2]^q,$$

$$\frac{d[B_2]}{dt} = +k_b [S][A_2]^p [C_2]^q, \qquad (15)$$

$$\frac{d[C_2]}{dt} = -k_c [S][A_2]^p [C_2]^q.$$

wherein $A_1$, $B_1$, and $C_1$ represent the resist A, by-product B, and developer C respectively for this separate calculation of the chemical reaction. The above equations (15) can be approximately solved as follows.

$$[A_2] = \frac{[A_1]}{[1 + (p-1)k_a [A_1]^{p-1}[S] \int [C]^q dt]^{\frac{1}{p-1}}}, \qquad (16)$$

$$[B_2] = [B_1] + \frac{k_b}{k_a}([A_1] - [A_2]),$$

$$[C_2] = [C_1] - \frac{k_c}{k_a}([A_1] - [A_2]).$$

by an explicit method, assuming $$\int [C]^q dt \approx [C_1]^q T \qquad (17)$$

or by an implicit method, assuming $$\int [C]^q dt \approx 0.5([C_1]^q + [C_2]^q)T \text{ or similar relationships} \qquad (18)$$

So, if p=1 and q=1, A can be solved without approximation as:

$$[A_2] = \frac{[A_1](k_c[A_1] - k_a[C_1])}{k_c[A_1] - k_a[C_1]e^{-(k_c[A_1] - k_a[C_1])[S]T}} \qquad (19)$$

At 670, solving for the horizontal (X and Y) diffusion without solving for the chemical reaction can described by the following equations:

$$\frac{\partial [B_3]}{\partial t} = \frac{\partial}{\partial x} D_b \frac{\partial [B_3]}{\partial x} + \frac{\partial}{\partial y} D_b \frac{\partial [B_3]}{\partial y}, \qquad (20)$$

$$\frac{\partial [C_3]}{\partial t} = \frac{\partial}{\partial x} D_c \frac{\partial [C_3]}{\partial x} + \frac{\partial}{\partial y} D_c \frac{\partial [C_3]}{\partial y}.$$

wherein $B_3$ and $C_3$ represent the by-product B and developer C respectively for this separate calculation of the horizontal diffusion and D is in general a function of A, B, and C. So, at 670, the resist development model reduces to two dimensional diffusion equations with non-uniform diffusivities.

Equations (20) can be solved in one of several ways, for example:

By a rigorous method such as via finite difference
By an approximate method—if the diffusivity is uniform, the solution can be obtained by a two-dimensional Gaussian convolution with a constant sigma on the initial value. So, in an embodiment, an approximation of the solution for non-uniform diffusivity can be obtained by a two-dimensional Gaussian convolution with a variable sigma such as:

$$[B_3(x,y)] = \int [B_2(x',y')] G(x-x', y-y' | \sigma_b(x,y)) dx' dy' \qquad (21)$$

$$[C_3(x,y)] = \int [C_2(x',y')] G(x-x', y-y' | \sigma_c(x,y)) dx' dy' \qquad (22)$$

$$\sigma(x,y) = \sqrt{2D(x,y)T} \qquad (23)$$

$$[A_3] = [A_2] \qquad (24)$$

At 680, solving for the chemical reaction without solving for the diffusion can described by the following equations:

$$\frac{d[A_4]}{dt} = -k_a [S][A_4]^p [C_4]^q,$$

$$\frac{d[B_4]}{dt} = +k_b [S][A_4]^p [C_4]^q, \qquad (25)$$

$$\frac{d[C_4]}{dt} = -k_c [S][A_4]^p [C_4]^q.$$

wherein $A_4$, $B_4$, and $C_4$ represent the resist A, by-product B, and developer C respectively for this separate calculation of the chemical reaction. The above equations (25) can be approximately solved as follows.

$$[A_4] = \frac{[A_3]}{[1 + (p-1)k_a [A_3]^{p-1}[S] \int [C]^q dt]^{\frac{1}{p-1}}}, \qquad (26)$$

$$[B_4] = [B_3] + \frac{k_b}{k_a}([A_3] - [A_4]),$$

$$[C_4] = [C_3] - \frac{k_c}{k_a}([A_3] - [A_4]).$$

by an explicit method, assuming $$\int [C]^q dt \approx [C_3]^q T \qquad (27)$$

or by an implicit method, assuming $$\int [C]^q dt \approx 0.5([C_3]^q + [C_4]^q)T \text{ or similar relationships} \qquad (28)$$

So, if p=1 and q=1, A can be solved without approximation as:

$$[A_4] = \frac{[A_3](k_c[A_3] - k_a[C_3])}{k_c[A_3] - k_a[C_3]e^{-(k_c[A_3] - k_a[C_3])[S]T}} \quad (29)$$

As will be appreciated in solving the equations for a certain development time, the steps 650-680 can be iterated. Moreover, the output of an iteration of one of the steps 650-680 can be used as the input for the iteration of one or more of the other steps 650-680. So, for example, an iteration can "cycle" through steps 650-680 in order and then the output from step 680 can be the input of another iteration of steps 650-680.

In an embodiment, the characteristic of the development of the resist layer can be used for various purposes. For example, in an embodiment, a parameter of a device manufacturing process or a device manufacturing apparatus is adjusted based on the characteristic of the development of the resist layer. In an embodiment, the adjustment can comprise control of an aspect of the process or apparatus, design of an aspect of the process or apparatus, etc. As an example, in an embodiment, the parameter is a parameter of a design layout to be applied to the resist layer. For example, the parameter of the design layout can be an optical proximity correction, a resolution enhancement technique (such as sub-resolution scattering feature), a mask bias, etc. In an embodiment, a patterning device pattern can be manufactured (e.g., formed in a physical mask or reticle) or created (e.g., formed by a programmable patterning device) after adjusting the parameter. In an embodiment, the resist layer is one that will undergo a physical or chemical treatment during the device manufacturing process or using the device manufacturing apparatus. In an embodiment, the device manufacturing apparatus is selected from: a lithographic apparatus, an etcher, a spin coating device, an oven, an optical metrology tool, an electron microscope, an ion implanter, a deposition chamber, or any combination selected therefrom.

In an embodiment, the characteristic of the development of the resist layer can be characterized as a physical or geometric characteristic (including any change in such a characteristic). In an embodiment, the characteristic of the development of the resist layer is an amount, or change in amount, of resist, a displacement of material, a CD or change in CD, or an edge placement error or change in edge placement error.

The characteristics of the development obtained using actual processing conditions of a device manufacturing process under which the resist layer is processed may be used for determining or predicting, existence, probability of existence, one or more characteristics, or a combination thereof, of a defect produced with the device manufacturing process.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a patterning process, it is possible and economical to focus on the hot spots. When the hot spots are not defective, it is most likely that all the patterns are not defective.

The resist development may affect the process window of an individual pattern of a design layout because the resist development may affect a final developed resist image produced from the individual pattern, which developed resist image typically guides an etching process. Therefore, resist development may affect the overlapping process window (OPW) of a group of patterns of the design layout because the OPW is the overlap of the processing windows of the individual patterns of the group. Existence, probability of existence, one or more characteristics, or a combination thereof, of a defect may be determined or predicted using the OPW affected by the resist development. If the values of the processing parameters fall within the OPW affected by the resist development, a defect does not or is unlikely to exist. Therefore, taking a resist development characteristic as described herein into account allows more accurate determination of the OPW. So, in an embodiment, an overlapping process window (OPW) of a plurality of patterns of a design layout is determined based on the characteristic of the development. In an embodiment, existence, probability of existence, one or more characteristics, or a combination thereof, of a defect produced from the plurality of patterns, is determined or predicted based on the OPW.

The capability of determining a resist development characteristic as described herein may benefit many processes involved in patterning processes. For example, these processes may include optical proximity correction in the design layout, resolution enhancement techniques (RET), optimization of numerical aperture and/or optical coherence settings, customized illumination schemes, development of phase shifting patterning devices, source-mask optimization, source-mask-projection system optimization, mask optimization, yield optimization, process window optimization, etc. This is because the resist development characteristic may affect the cost function used in such optimizations.

In an optimization for a device manufacturing apparatus or process, a cost function may be expressed as $$CF(z_1, z_2, \ldots, z_N) = \sum_{p=1}^{P} w_p f_p^2(z_1, z_2, \ldots, z_N) \quad (30)$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image or pattern (including a resist layer distribution as determined by a resist development model as described herein), or aerial image, or any combination selected therefrom. In an embodiment, the design variables $(z_1, z_2, \ldots, z_N)$ comprise dose, global bias of the patterning device pattern, a shape or other characteristic of a patterning device illumination, or any combination selected therefrom. Since it is the resist image or pattern that often dictates the device pattern on a substrate, the cost function often includes functions that represent some characteristics of the resist image or pattern. For example, $f_p(z_1, z_2, \ldots, z_N)$ of such an evaluation point can be simply a distance between a point in the resist image or pattern to an intended position of that point (i.e., edge placement error $EPE_p(z_1, z_2, \ldots, z_N)$). Resist development may affect the edge placement error $EPE_p(z_1, z_2, \ldots, z_N)$ because resist development may move the location of an edge and thus may change the distance between the edge and its intended location (i.e., $EPE_p(z_1, z_2, \ldots, z_N)$). At least one characteristic of the development of the resist layer may be a function of the design variables.

The design variables can be any adjustable parameters such as adjustable parameters of the illumination, the patterning device pattern (including the patterning device itself), the projection optics, dose, focus, etc. The lithographic apparatus may include a component called a "wavefront manipulator" that can be used to adjust a shape of a wavefront and intensity distribution and/or adjust a phase shift of the radiation beam. In an embodiment, the wavefront and intensity distribution can be adjusted at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution caused by, for example, the illumination, the patterning device pattern, temperature variation in the lithographic apparatus, thermal expansion of a component of the lithographic projection apparatus, etc. Adjusting the wavefront and intensity distribution can change values of the evaluation points and the cost function. Such changes can be simulated from a model or actually measured. Of course, $CF(z_1, z_2, \ldots, z_N)$ is not limited to the form in equation (30). $CF(z_1, z_2, \ldots, z_N)$ can be in any other suitable form.

The design variables may have constraints, which can be expressed as $(z_1, z_2, \ldots, z_N) \in Z$, where Z is a set of possible values of the design variables. One possible constraint on the design variables may be imposed by a desired throughput of the lithographic apparatus. For example, a lower bound of desired throughput leads to an upper bound on the dose. Shorter exposure time and/or lower dose generally lead to higher throughput but can result in greater stochastic variation. Consideration of substrate throughput and minimization of a stochastic variation may constrain the possible values of the design variables because the stochastic variations are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. Throughput may also be affected by the resist chemistry. Slower resist (e.g., a resist that requires higher amount of light to be properly exposed) leads to lower throughput.

The optimization process therefore is to find a set of values of the design variables, under the constraints $(z_1, z_2, \ldots, z_N) \in Z$, that minimize or maximize cost function, e.g., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) \quad (31)$$

In an embodiment, a general method of optimizing comprises defining a multi-variable cost function of a plurality of design variables. The design variables may comprise any suitable combination selected from, e.g., characteristics of the illumination (e.g., pupil fill ratio, namely percentage of radiation of the source that passes through a pupil or aperture), characteristics of the projection optics and/or characteristics of the design layout. For example, the design variables may include characteristics of the illumination (300A) and characteristics of the design layout (e.g., global bias) but not characteristics of the projection optics, which leads to a SMO. Or, the design variables may include characteristics of the illumination, characteristics of the projection optics and characteristics of the design layout, which leads to a source-mask-lens optimization (SMLO). In an embodiment, in the optimization, the design variables are simultaneously adjusted so that the cost function is moved towards convergence. During execution of the cost function, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. So, if one or more of the termination condition is satisfied, the method ends. If one or more of the conditions is not satisfied, the evaluation of the cost function and testing against a termination condition is iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user to pick one or more sets.

In an optimization, the illumination, patterning device pattern and projection optics can be optimized alternatively (referred to as alternative optimization) or optimized simultaneously (referred to as simultaneous optimization). The terms "simultaneous", "simultaneously", "joint" and "jointly" as used in that context mean that the design variables of the characteristics of the illumination, patterning device pattern, projection optics and/or any other design variables, are allowed to change at the same time. The term "alternative" and "alternatively" as used in that context mean that not all of the design variables are allowed to change at the same time.

In an embodiment, an optimization of all the design variables is executed simultaneously. Such a flow may be called a simultaneous flow or co-optimization flow. In an embodiment, an optimization of all the design variables is executed alternatively. In this flow, in each step, some design variables are fixed while the other design variables are optimized to minimize or maximize the cost function; then in the next step, a different set of variables are fixed while the others are optimized to minimize or maximize the cost function. These steps are executed alternatively until convergence or one or more certain terminating conditions are met. For example, in an embodiment, a design layout is obtained, and then a step of illumination optimization is executed, where all the design variables of the illumination are optimized (SO) to minimize or maximize the cost function while all the other design variables are fixed. Then, a mask optimization (MO) is performed, where all the design variables of the patterning device pattern are optimized to minimize or maximize the cost function while all the other design variables are fixed. These two steps are executed alternatively, until a certain terminating condition is met. Various termination conditions can be used, such as, the value of the cost function becomes equal to a threshold value, the value of the cost function crosses the threshold value, the value of the cost function reaches within a preset error limit, or a preset number of iterations is reached, etc. Note that SO-MO alternative optimization is used as an example for the alternative flow. The alternative optimization flow can take many different forms, such as SO-LO-MO alternative optimization, where SO, LO (projection optics optimization) is executed, and then MO is executed alternatively and iteratively; or first SMO can be executed once, then execute LO and MO alternatively and iteratively; and so on. Finally the output of the optimization result is obtained.

In an embodiment, a method of optimization involves minimization of a cost function. Initially, initial values of design variables are obtained, including their tuning ranges, if any. A multi-variable cost function is set up and then is expanded within a small enough neighborhood around the starting point value of the design variables for the first iterative step. Standard multi-variable optimization techniques are applied to minimize the cost function. Note that the optimization problem can apply constraints, such as tuning ranges, during the optimization process or at a later stage in the process. In an embodiment, each iteration is done for one or more given test patterns (also known as "gauges") for the identified evaluation points that have been selected to optimize the device manufacturing process; the gauges can be dimensions from a simulated resist image or pattern. A lithographic response is then predicted and compared with a desired or ideal lithographic response value. If a termination condition is satisfied, e.g., the optimization generates a lithographic response value sufficiently close to the desired value, and then the final value of the design variables is outputted. The output step may also include outputting other functions using the final values of the design variables, such as outputting an optimized illumination, an optimized design layout, etc. If the termination condition is not satisfied, then the values of the design variables are updated with the result of the particular iteration, and the process repeats by evaluating the cost function with one or more test pattern until a termination condition is satisfied.

The concepts disclosed herein may simulate or mathematically model any pattern transfer system, and may be especially useful with pattern transfer systems using radiation to form patterns in the resist.

In an embodiment, there is provided a method, comprising: obtaining a set of conditions for a resist development model for simulating a resist development process of a resist layer; and performing, by a hardware computer system, a computer simulation of the resist development process using the set of conditions and the resist development model to obtain a characteristic of the development of the resist layer, wherein the computer simulation separately simulates different certain different physical and chemical processes and characteristics of the resist development process.

In an embodiment, the resist development model separately models a chemical reaction between the resist and the developer from diffusion of the developer and of a by-product from the chemical reaction between the resist and the developer. In an embodiment, the resist development model further models the generation of the by-product and depletion of the developer. In an embodiment, the resist development model comprises separate mathematical terms for modeling chemical reactions from mathematical terms for modeling diffusions. In an embodiment, the resist development model comprises separate variables for an amount of undissolved resist, for an amount of dissolved resist and for developer concentration. In an embodiment, the variables are normalized. In an embodiment, the method comprises determining a characteristic of a diffusion in the development of the resist layer as if there were no chemical reaction in the development of the resist layer; determining a characteristic of the chemical reaction in the development of the resist layer as if there were no diffusion in the development of the resist layer; and determining the characteristic of the development of the resist layer based on the characteristic of the diffusion and the characteristic of the chemical reaction. In an embodiment, the method comprises: determining a characteristic of diffusion in the development of the resist layer in a first direction, as if there were no diffusion in any directions perpendicular to the first direction; determining a characteristic of diffusion in the development of the resist layer in a second direction as if there were no diffusion in the first direction, the second direction being different from the first direction; and determining the characteristic of the development of the resist layer based on the characteristic of the diffusion in the first direction and the characteristic of the diffusion in the second direction. In an embodiment, the second direction is perpendicular to the first direction. In an embodiment, the resist layer is on a substrate. In an embodiment, the first direction is perpendicular to a main surface of the substrate. In an embodiment, the second direction is substantially parallel to a main surface of the substrate. In an embodiment, the resist layer is a radiation-sensitive resist layer and the set of conditions comprises a solubility distribution within the resist layer arising from exposure of the resist layer. In an embodiment, the method further comprises adjusting a parameter of a device manufacturing process or a device manufacturing apparatus based on the characteristic of the development of the resist layer. In an embodiment, the parameter is a parameter of a design layout to be applied to the resist layer. In an embodiment, the method further comprises manufacturing or creating a patterning device pattern after adjusting the parameter. In an embodiment, the resist layer will undergo a physical or chemical treatment during the device manufacturing process or using the device manufacturing apparatus. In an embodiment, the characteristic of the development of the resist layer is an amount, or change in amount, of resist, a displacement of material, a CD or change in CD, or an edge placement error or change in edge placement error. In an embodiment, the resist is a positive tone resist or a negative tone resist.

In an embodiment, there is provided a method comprising: determining, by a hardware computer system, a characteristic of a diffusion in the development of a resist layer as if there were no chemical reaction in the development of the resist layer; determining, by the hardware computer system, a characteristic of the chemical reaction in the development of the resist layer as if there were no diffusion in the development of the resist layer; and determining, by the hardware computer system, a characteristic of the development of the resist layer based on the characteristic of the diffusion and the characteristic of the chemical reaction.

In an embodiment, the method further comprises determining, by the hardware computer system, a characteristic of diffusion in the development of a resist layer in a first direction, as if there were no diffusion in any directions perpendicular to the first direction; determining, by the hardware computer system, a characteristic of diffusion in the development of the resist layer in a second direction as if there were no diffusion in the first direction, the second direction being different from the first direction; and determining, by the hardware computer system, the characteristic of the development of the resist layer based on the characteristic of the diffusion in the first direction and the characteristic of the diffusion in the second direction. In an embodiment, the second direction is perpendicular to the first direction. In an embodiment, the determining the characteristic of the diffusion and of the chemical reaction comprises performing, by a hardware computer system, a computer simulation of the development of the resist layer using a resist development model, wherein the computer simulation separately simulates different certain different physical and chemical processes and characteristics of the resist development process. In an embodiment, the resist development model separately models a chemical reaction between the resist and the developer from diffusion of the developer and of a by-product from the chemical reaction between the resist and the developer. In an embodiment, the resist development model further models the generation of the by-product and depletion of the developer. In an embodiment, the resist development model comprises separate mathematical terms for modeling chemical reactions from mathematical terms for modeling diffusions. In an embodiment, the resist development model comprises separate variables for an amount of undissolved resist, for an amount of dissolved resist and for developer concentration. In an embodiment, the variables are normalized. In an embodiment, the method further comprises adjusting a parameter of a device manufacturing process or a device manufacturing apparatus based on the characteristic of the development of the resist layer. In an embodiment, the parameter is a parameter of a design layout to be applied to the resist layer. In an embodiment, the resist layer will undergo a physical or chemical treatment during the device manufacturing process or using the device manufacturing apparatus. In an embodiment, the characteristic of the development of the resist layer is an amount, or change in amount, of resist, a displacement of material, a CD or change in CD, or an edge placement error or change in edge placement error. In an embodiment, the resist is a positive tone resist or a negative tone resist.

In an embodiment, there is provided a method comprising: determining, by a hardware computer system, a characteristic of diffusion in the development of a resist layer in a first direction, as if there were no diffusion in any directions perpendicular to the first direction; determining, by the hardware computer system, a characteristic of diffusion in the development of the resist layer in a second direction as if there were no diffusion in the first direction, the second direction being different from the first direction; and determining, by the hardware computer system, a characteristic of the development of the resist layer based on the characteristic of the diffusion in the first direction and the characteristic of the diffusion in the second direction.

In an embodiment, the second direction is perpendicular to the first direction. In an embodiment, the method further comprises obtaining a characteristic of diffusion in the development of the resist layer in a third direction as if there were no diffusion in the first direction and/or the second direction. In an embodiment, obtaining the characteristic of three-dimensional diffusion in the development of the resist layer is additionally based on the characteristic of diffusion in the development of the resist layer in the third direction. In an embodiment, the first, second and third directions are mutually perpendicular. In an embodiment, the determining the characteristic of the diffusion in the development of the resist layer in the first and/or second direction comprises performing, by a hardware computer system, a computer simulation of the development of the resist layer using a resist development model, wherein the computer simulation separately simulates different certain different physical and chemical processes and characteristics of the resist development process. In an embodiment, the resist development model separately models a chemical reaction between the resist and the developer from diffusion of the developer and of a by-product from the chemical reaction between the resist and the developer. In an embodiment, the resist development model further models the generation of the by-product and depletion of the developer. In an embodiment, the resist development model comprises separate mathematical terms for modeling chemical reactions from mathematical terms for modeling diffusions. In an embodiment, the resist development model comprises separate variables for an amount of undissolved resist, for an amount of dissolved resist and for developer concentration. In an embodiment, the variables are normalized. In an embodiment, the method further comprises adjusting a parameter of a device manufacturing process or a device manufacturing apparatus based on the characteristic of the development of the resist layer. In an embodiment, the parameter is a parameter of a design layout to be applied to the resist layer. In an embodiment, the resist layer will undergo a physical or chemical treatment during the device manufacturing process or using the device manufacturing apparatus. In an embodiment, the characteristic of the development of the resist layer is an amount, or change in amount, of resist, a displacement of material, a CD or change in CD, or an edge placement error or change in edge placement error. In an embodiment, the resist is a positive tone resist or a negative tone resist.

Figure 7:
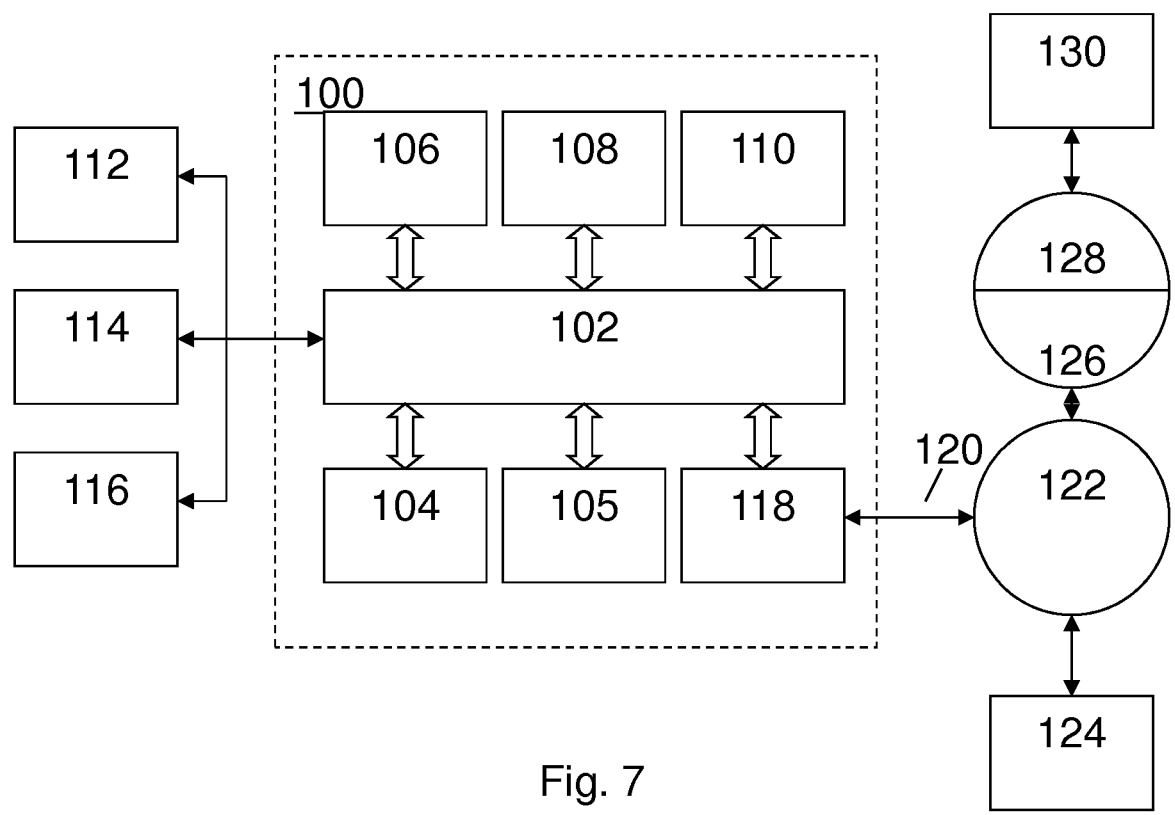
FIG. 7 is a block diagram of an example computer system.

FIG. 7 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
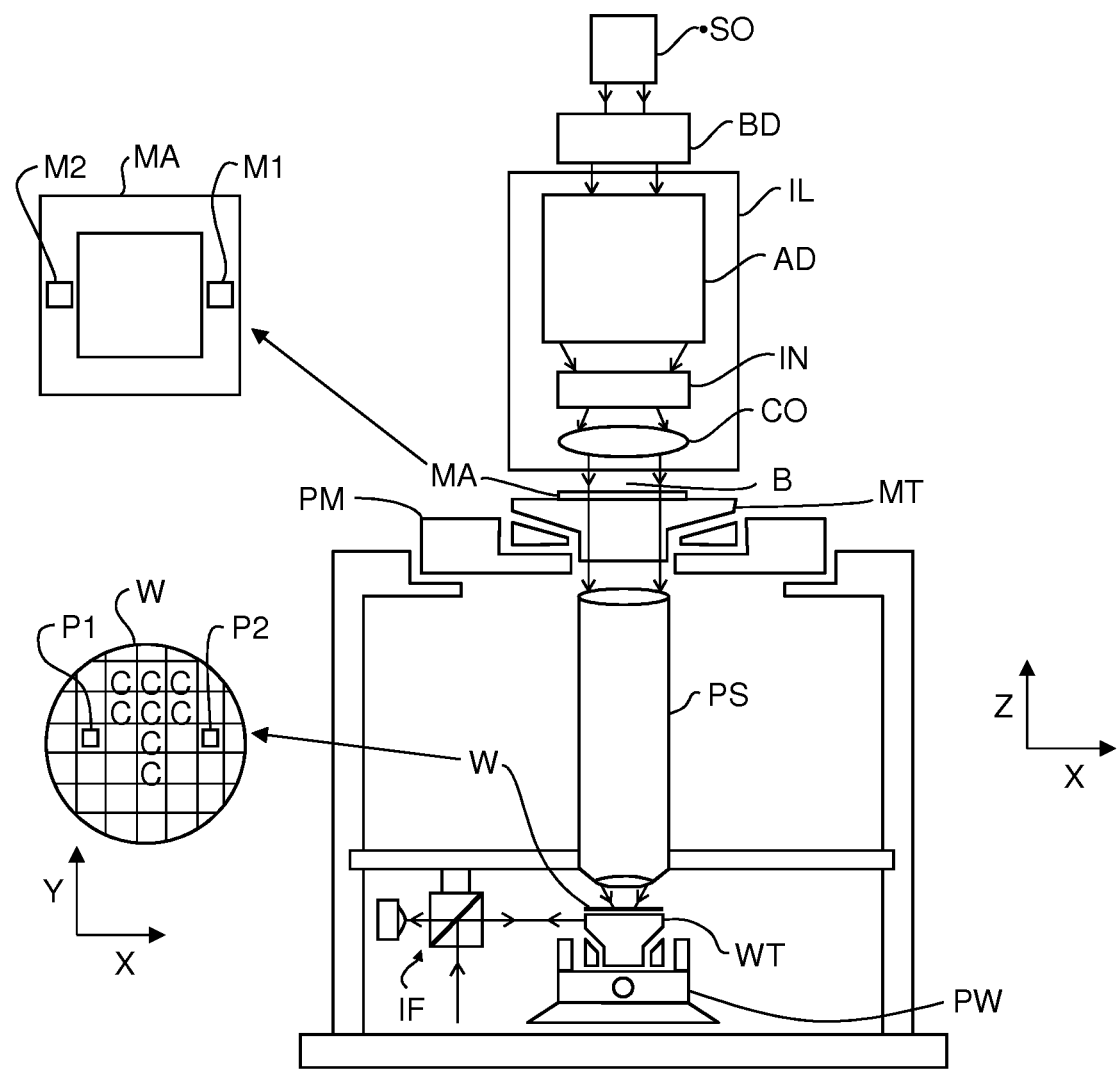
FIG. 8 is a schematic diagram of a lithographic projection apparatus.

FIG. 8 schematically depicts an exemplary lithographic projection apparatus for use with the methods described herein. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the patterning device table MT may just be connected to a short stroke actuator, or may be fixed.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.
- a programmable LCD array.

The depicted tool can be used in two different modes:

- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
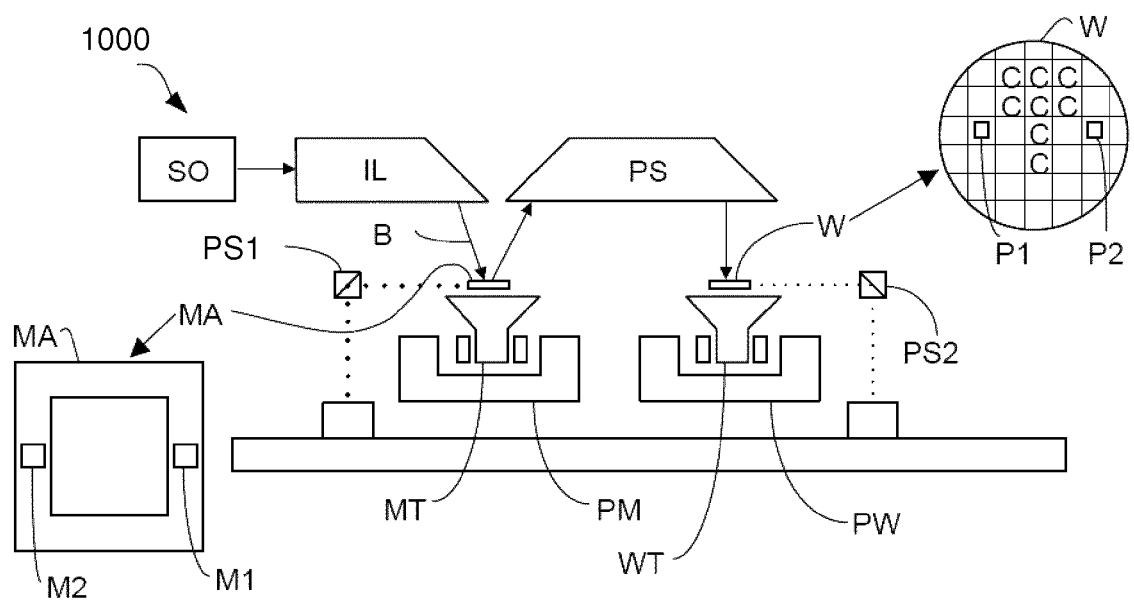
FIG. 9 is a schematic diagram of another lithographic projection apparatus.

FIG. 9 schematically depicts another exemplary lithographic projection apparatus 1000 whose illumination source could be optimized utilizing the methods described herein.

The lithographic projection apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

The lithographic apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference in its entirety.

Figure 10:
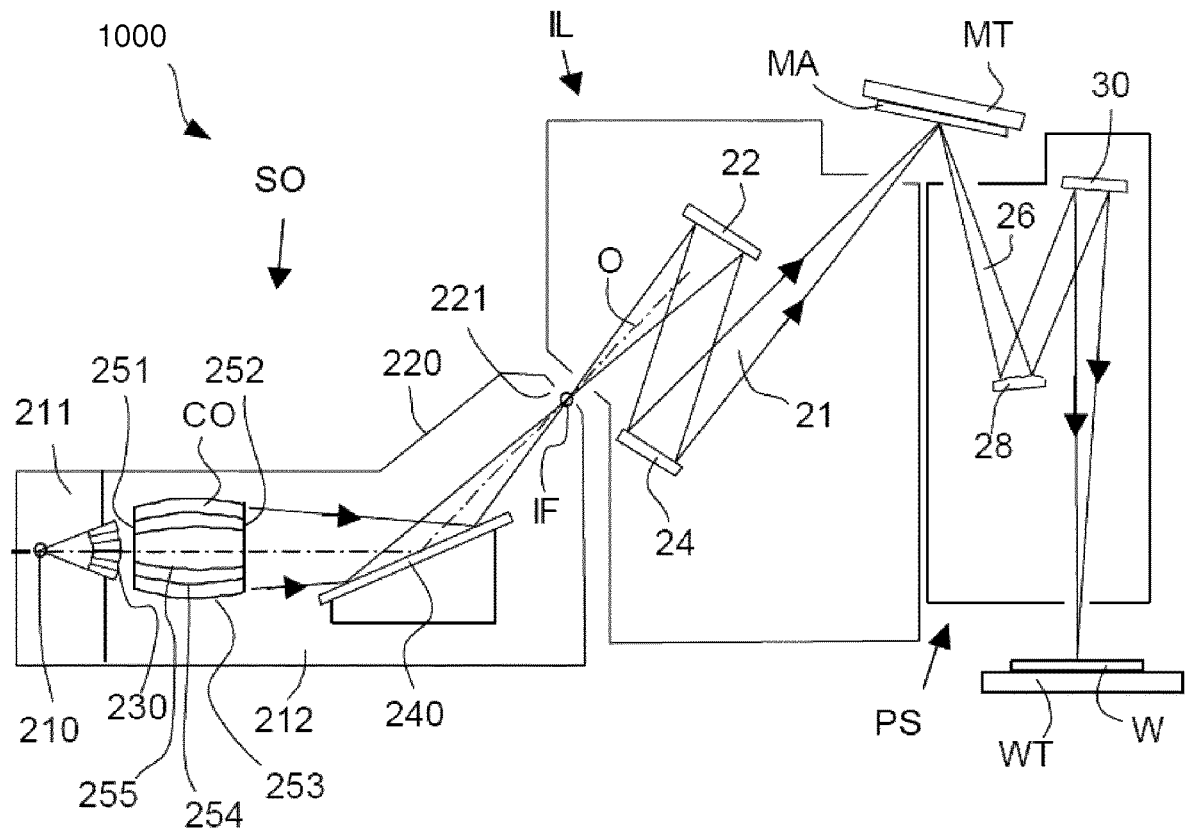
FIG. 10 is a more detailed view of the apparatus in FIG. 9.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 11:
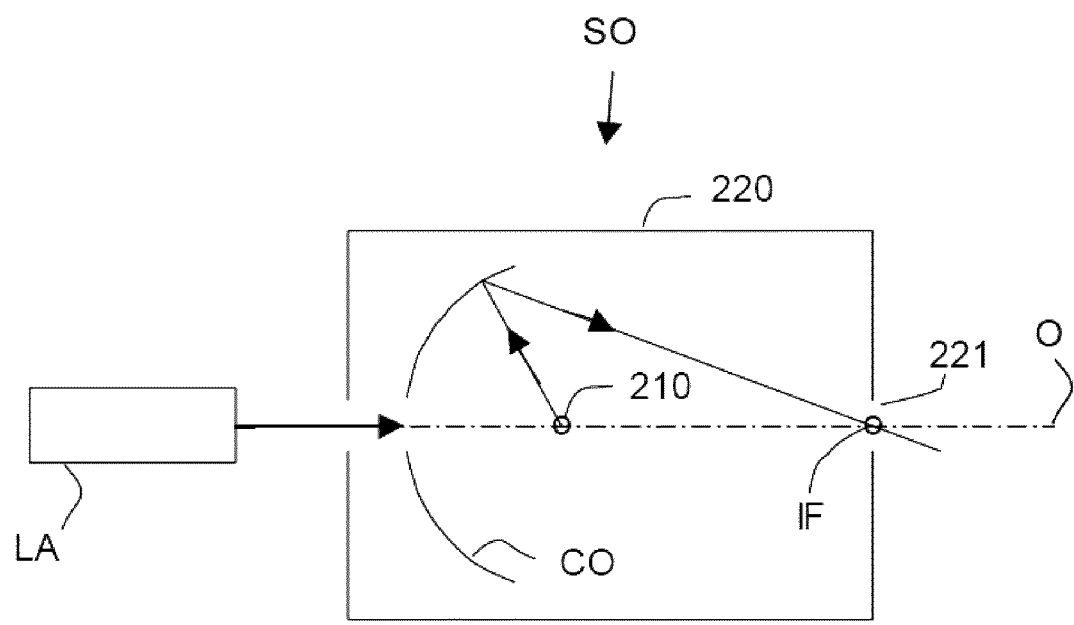
FIG. 11 is a more detailed view of the source collector module SO of the apparatus of FIG. 9 and FIG. 10.
Figure 11:
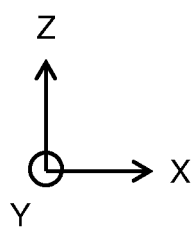

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method, comprising:
    obtaining a set of conditions for a resist development model for simulating a resist development process of a resist layer; and
    performing, by a hardware computer system, a computer simulation of the resist development process using the set of conditions and the resist development model to obtain a characteristic of the development of the resist layer, wherein the computer simulation is configured to simulate certain different physical and chemical processes and characteristics of the resist development process separately.
2. The method of clause 1, wherein the resist development model models a chemical reaction between the resist and the developer separately from diffusion of the developer and of a by-product from the chemical reaction between the resist and the developer.
3. The method of clause 2, wherein the resist development model further models the generation of the by-product and depletion of the developer.
4. The method of clause 2 or clause 3, wherein the resist development model comprises mathematical terms for modeling chemical reactions separate from mathematical terms for modeling diffusions.
5. The method of any of clauses 1 to 4, wherein the resist development model comprises separate variables for an amount of undissolved resist, for an amount of dissolved resist, and for developer concentration.
6. The method of clause 5, wherein the variables are normalized.
7. The method of any of clauses 1 to 6, comprising:
    determining a characteristic of a diffusion in the development of the resist layer as if there were no chemical reaction in the development of the resist layer;
    determining a characteristic of the chemical reaction in the development of the resist layer as if there were no diffusion in the development of the resist layer; and
    determining the characteristic of the development of the resist layer based on the characteristic of the diffusion and the characteristic of the chemical reaction.
8. The method of any of clauses 1 to 7, comprising:
    determining a characteristic of diffusion in the development of the resist layer in a first direction, as if there were no diffusion in any directions perpendicular to the first direction;
    determining a characteristic of diffusion in the development of the resist layer in a second direction as if there were no diffusion in the first direction, the second direction being different from the first direction; and
    determining the characteristic of the development of the resist layer based on the characteristic of the diffusion in the first direction and the characteristic of the diffusion in the second direction.
9. The method of clause 8, wherein the second direction is perpendicular to the first direction.
10. The method of any of clauses 1 to 9, wherein the resist layer is on a substrate.
11. The method of clause 10, wherein the first direction is perpendicular to a main surface of the substrate.
12. The method of clause 10 or clause 11, wherein the second direction is substantially parallel to a main surface of the substrate.
13. The method of any of clauses 1 to 12, wherein the resist layer is a radiation-sensitive resist layer and the set of conditions comprises a solubility distribution within the resist layer arising from exposure of the resist layer.
14. The method of any of clauses 1 to 13, further comprising adjusting a parameter of a device manufacturing process or a device manufacturing apparatus based on the characteristic of the development of the resist layer.
15. The method of clause 14, wherein the parameter is a parameter of a design layout to be applied to the resist layer.
16. The method of clause 15, further comprising manufacturing or creating a patterning device pattern after adjusting the parameter.
17. The method of any of clauses 14 to 16, wherein the resist layer is configured to undergo a physical or chemical treatment during the device manufacturing process or using the device manufacturing apparatus.
18. The method of any of clauses 1 to 17, wherein the characteristic of the development of the resist layer is an amount, or change in amount, of resist, a displacement of material, a CD or change in CD, or an edge placement error or change in edge placement error.
19. The method of any of clauses 1 to 18, wherein the resist is a positive tone resist or a negative tone resist.
20. A method comprising:
    determining, by a hardware computer system, a characteristic of a diffusion in the development of a resist layer as if there were no chemical reaction in the development of the resist layer;
    determining, by the hardware computer system, a characteristic of the chemical reaction in the development of the resist layer as if there were no diffusion in the development of the resist layer; and
    determining, by the hardware computer system, a characteristic of the development of the resist layer based on the characteristic of the diffusion and the characteristic of the chemical reaction.
21. The method of clause 20, further comprising:
    determining, by the hardware computer system, a characteristic of diffusion in the development of a resist layer in a first direction, as if there were no diffusion in any directions perpendicular to the first direction;
    determining, by the hardware computer system, a characteristic of diffusion in the development of the resist layer in a second direction as if there were no diffusion in the first direction, the second direction being different from the first direction; and
    determining, by the hardware computer system, the characteristic of the development of the resist layer based on the characteristic of the diffusion in the first direction and the characteristic of the diffusion in the second direction.
22. The method of clause 21, wherein the second direction is perpendicular to the first direction.
23. The method of any of clauses 20 to 22, wherein the determining the characteristic of the diffusion and of the chemical reaction comprises performing, by a hardware computer system, a computer simulation of the development of the resist layer using a resist development model, wherein the computer simulation is configured to simulate certain different physical and chemical processes and characteristics of the resist development process separately.

24. The method of clause 23, wherein the resist development model models a chemical reaction between the resist and the developer separately from diffusion of the developer and of a by-product from the chemical reaction between the resist and the developer.

25. The method of clause 24, wherein the resist development model further models the generation of the by-product and depletion of the developer.

26. The method of clause 24 or clause 25, wherein the resist development model comprises mathematical terms for modeling chemical reactions separate from mathematical terms for modeling diffusions.

27. The method of any of clauses 23 to 26, wherein the resist development model comprises separate variables for an amount of undissolved resist, for an amount of dissolved resist and for developer concentration.

28. The method of clause 27, wherein the variables are normalized.

29. The method of any of clauses 20 to 28, further comprising adjusting a parameter of a device manufacturing process or a device manufacturing apparatus based on the characteristic of the development of the resist layer.

30. The method of clause 29, wherein the parameter is a parameter of a design layout to be applied to the resist layer.

31. The method of clause 29 or clause 30, wherein the resist layer is configured to undergo a physical or chemical treatment during the device manufacturing process or using the device manufacturing apparatus.

32. The method of any of clauses 20 to 31, wherein the characteristic of the development of the resist layer is an amount, or change in amount, of resist, a displacement of material, a CD or change in CD, or an edge placement error or change in edge placement error.

33. The method of any of clauses 20 to 32, wherein the resist is a positive tone resist or a negative tone resist.

34. A method comprising:
   determining, by a hardware computer system, a characteristic of diffusion in the development of a resist layer in a first direction, as if there were no diffusion in any directions perpendicular to the first direction;
   determining, by the hardware computer system, a characteristic of diffusion in the development of the resist layer in a second direction as if there were no diffusion in the first direction, the second direction being different from the first direction; and
   determining, by the hardware computer system, a characteristic of the development of the resist layer based on the characteristic of the diffusion in the first direction and the characteristic of the diffusion in the second direction.

35. The method of clause 34, wherein the second direction is perpendicular to the first direction.

36. The method of clause 34 or clause 35, further comprising obtaining a characteristic of diffusion in the development of the resist layer in a third direction as if there were no diffusion in the first direction and/or the second direction.

37. The method of clause 36, wherein obtaining the characteristic of three-dimensional diffusion in the development of the resist layer is additionally based on the characteristic of diffusion in the development of the resist layer in the third direction.

38. The method of clause 36 or clause 37, wherein the first, second and third directions are mutually perpendicular.

39. The method of any of clauses 34 to 38, wherein the determining the characteristic of the diffusion in the development of the resist layer in the first and/or second direction comprises performing, by a hardware computer system, a computer simulation of the development of the resist layer using a resist development model, wherein the computer simulation is configured to simulate certain different physical and chemical processes and characteristics of the resist development process separately 40. The method of clause 39, wherein the resist development model models a chemical reaction between the resist and the developer separately from diffusion of the developer and of a by-product from the chemical reaction between the resist and the developer.

41. The method of clause 40, wherein the resist development model further models the generation of the by-product and depletion of the developer.

42. The method of clause 40 or clause 41, wherein the resist development model comprises separate mathematical terms for modeling chemical reactions from mathematical terms for modeling diffusions.

43. The method of any of clauses 39 to 42, wherein the resist development model comprises separate variables for an amount of undissolved resist, for an amount of dissolved resist and for developer concentration.

44. The method of clause 43, wherein the variables are normalized.

45. The method of any of clauses 34 to 44, further comprising adjusting a parameter of a device manufacturing process or a device manufacturing apparatus based on the characteristic of the development of the resist layer.

46. The method of clause 45, wherein the parameter is a parameter of a design layout to be applied to the resist layer.

47. The method of clause 45 or clause 46, wherein the resist layer is configured to undergo a physical or chemical treatment during the device manufacturing process or using the device manufacturing apparatus.

48. The method of any of clauses 34 to 47, wherein the characteristic of the development of the resist layer is an amount, or change in amount, of resist, a displacement of material, a CD or change in CD, or an edge placement error or change in edge placement error.

49. The method of any of clauses 34 to 48, wherein the resist is a positive tone resist or a negative tone resist.

50. A non-transitory computer program product comprising machine-readable instructions for causing a processor to cause performance of the method of any of clauses 1 to 49.

Although specific reference may be made in this text to the manufacture of ICs, it should be explicitly understood that the description herein has many other possible applications. For example, it may be employed in the manufacture of integrated optical systems, guidance and detection patterns for magnetic domain memories, micro-electro mechanical systems (MEMS), liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, that a physical patterning device is not necessarily used but a design layout can be used to represent a physical patterning device.

Lithography technologies already in use include EUV (extreme ultra violet) lithography that uses a wavelength within a range of 20 nm to 5 nm (which can be produced using a synchrotron or by hitting a material (either solid or a plasma) with high energy electrons in order to produce photons within this range). Also, DUV lithography can use, e.g., an about 193 nm wavelength with the use of an ArF laser or an about 157 nm wavelength with the use of a fluorine laser. In the present document, the terms "radiation" and "beam" are used to encompass all types of electromagnetic radiation, including ultraviolet radiation (e.g. with a wavelength of about 365, 248, 193, 157 or 126 nm) and EUV (extreme ultra-violet radiation, e.g. having a wavelength in the range of 5 nm-20 nm).

While the concepts disclosed herein may be used for imaging on a substrate such as a silicon wafer, it shall be understood that the disclosed concepts may be used with any type of lithographic systems, e.g., those used for imaging on substrates other than silicon wafers, using imprint steps, etc.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

In an optimization process of a system or process, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system or process can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image or pattern on a substrate, as well as non-physical characteristics such as dose and focus.

The term "optimizing" and "optimization" as used herein refers to or means adjusting a lithographic apparatus, a patterning process, etc. such that results and/or processes of lithography or patterning processing have more a desirable characteristic, such as higher accuracy of projection of a design layout on a substrate, a larger process window, etc.

Thus, the term "optimizing" and "optimization" as used herein refers to or means a process that identifies one or more values for one or more variables that provide an improvement, e.g. a local optimum, in at least one relevant metric, compared to an initial set of one or more values for those one or more variables. "Optimum" and other related terms should be construed accordingly. In an embodiment, optimization steps can be applied iteratively to provide further improvements in one or more metrics.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the disclosure as described without departing from the scope of the claims set out below.

What is claimed is:

1. A method, comprising:
   obtaining a set of conditions for a resist development model for simulating a resist development process of a resist layer; and
   performing, by a hardware computer system, a computer simulation of the resist development process using the set of conditions and the resist development model to obtain a characteristic of the development of the resist layer, wherein the computer simulation is configured to simulate a first physical or chemical process or characteristic of the resist development process independently from a second different physical or chemical process or characteristic of the resist development process and to separately simulate the second physical or chemical process or characteristic of the resist development process independently from the first physical or chemical process or characteristic of the resist development process.

2. The method of claim 1, wherein the resist development model models a chemical reaction between the resist and the developer separately from diffusion of the developer and of a by-product from the chemical reaction between the resist and the developer.

3. The method of claim 2, wherein the resist development model further models the generation of the by-product and depletion of the developer.

4. The method of claim 2, wherein the resist development model comprises mathematical terms for modeling chemical reactions separate from mathematical terms for modeling diffusion.

5. The method of claim 1, wherein the resist development model comprises separate variables for an amount of undissolved resist, for an amount of dissolved resist, and for developer concentration.

6. The method of claim 1, comprising:
   determining a characteristic of a diffusion in the development of the resist layer as if there were no chemical reaction in the development of the resist layer;
   determining a characteristic of a chemical reaction in the development of the resist layer as if there were no diffusion in the development of the resist layer; and
   determining the characteristic of the development of the resist layer based on the characteristic of the diffusion and the characteristic of the chemical reaction.

7. The method of claim 1, comprising:
   determining a characteristic of diffusion in the development of the resist layer in a first direction, as if there were no diffusion in any directions perpendicular to the first direction;

determining a characteristic of diffusion in the development of the resist layer in a second direction as if there were no diffusion in the first direction, the second direction being different from the first direction; and determining the characteristic of the development of the resist layer based on the characteristic of the diffusion in the first direction and the characteristic of the diffusion in the second direction.

8. The method of claim 7, wherein the second direction is perpendicular to the first direction.

9. The method of claim 1, wherein the resist layer is a radiation-sensitive resist layer and the set of conditions comprises a solubility distribution within the resist layer arising from exposure of the resist layer.

10. The method of claim 1, further comprising adjusting a parameter of a device manufacturing process or a device manufacturing apparatus based on the characteristic of the development of the resist layer.

11. The method of claim 10, wherein the parameter is a parameter of a design layout to be applied to the resist layer.

12. The method of claim 10, wherein the resist layer is configured to undergo a physical or chemical treatment during the device manufacturing process or using the device manufacturing apparatus.

13. The method of claim 1, wherein the characteristic of the development of the resist layer is an amount, or change in amount, of resist, a displacement of material, a CD or change in CD, or an edge placement error or change in edge placement error.

14. The method of claim 1, wherein the resist is a positive tone resist or a negative tone resist.

15. A non-transitory computer program product comprising machine-readable instructions therein, the instructions, upon execution by a computer system, configured to cause the computer system to at least:

obtain a set of conditions for a resist development model for simulating a resist development process of a resist layer; and perform a computer simulation of the resist development process using the set of conditions and the resist development model to obtain a characteristic of the development of the resist layer, wherein the computer simulation is configured to simulate a first physical or chemical process or characteristic of the resist development process independently from a second different physical or chemical process or characteristic of the resist development process and to separately simulate the second physical or chemical process or characteristic of the resist development process independently from the first physical or chemical process or characteristic of the resist development process.

16. The computer program product of claim 15, wherein the resist development model models a chemical reaction between the resist and the developer separately from diffusion of the developer and of a by-product from the chemical reaction between the resist and the developer.

17. The computer program product of claim 15, wherein the resist development model comprises separate variables for an amount of undissolved resist, for an amount of dissolved resist, and for developer concentration.

18. The computer program product of claim 15, wherein the instructions are further configured to cause the computer system to:

determine a characteristic of a diffusion in the development of the resist layer as if there were no chemical reaction in the development of the resist layer;

determine a characteristic of a chemical reaction in the development of the resist layer as if there were no diffusion in the development of the resist layer; and determine the characteristic of the development of the resist layer based on the characteristic of the diffusion and the characteristic of the chemical reaction.

19. The computer program product of claim 15, wherein the instructions are further configured to cause the computer system to:

determine a characteristic of diffusion in the development of the resist layer in a first direction, as if there were no diffusion in any directions perpendicular to the first direction;

determine a characteristic of diffusion in the development of the resist layer in a second direction as if there were no diffusion in the first direction, the second direction being different from the first direction; and determine the characteristic of the development of the resist layer based on the characteristic of the diffusion in the first direction and the characteristic of the diffusion in the second direction.

20. The computer program product of claim 15, wherein the instructions are configured to cause the computer system to adjust a parameter of a device manufacturing process or a device manufacturing apparatus based on the characteristic of the development of the resist layer.

* * * * *